(12) United States Patent
Wei et al.

(10) Patent No.: US 12,219,812 B2
(45) Date of Patent: Feb. 4, 2025

(54) DISPLAY SUBSTRATE AND DISPLAY APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Feng Wei, Beijing (CN); Lili Du, Beijing (CN); Yue Long, Beijing (CN); Bo Wei, Beijing (CN); Chao Wu, Beijing (CN)

(73) Assignees: Chengdu BOE Optoelectronics Technology Co., Ltd., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 384 days.

(21) Appl. No.: 17/763,026

(22) PCT Filed: May 17, 2021

(86) PCT No.: PCT/CN2021/094031
§ 371 (c)(1),
(2) Date: Mar. 23, 2022

(87) PCT Pub. No.: WO2022/001420
PCT Pub. Date: Jan. 6, 2022

(65) Prior Publication Data
US 2022/0344427 A1    Oct. 27, 2022

(30) Foreign Application Priority Data

Jun. 29, 2020    (CN) .......................... 202010606709.1

(51) Int. Cl.
*H10K 59/121*  (2023.01)
*H10K 59/131*  (2023.01)
*H10K 59/65*   (2023.01)

(52) U.S. Cl.
CPC ..... *H10K 59/1213* (2023.02); *H10K 59/1216* (2023.02); *H10K 59/131* (2023.02); *H10K 59/65* (2023.02)

(58) Field of Classification Search
USPC ........................................... 257/40
See application file for complete search history.

(56) References Cited

U.S. PATENT DOCUMENTS 10,950,170 B2    3/2021 Li
11,367,765 B2    6/2022 Ka et al.
(Continued)

FOREIGN PATENT DOCUMENTS

CN    107887421 A    4/2018
CN    108039148 A    5/2018
(Continued)

OTHER PUBLICATIONS

International Search Report of PCT/CN2021/094031 dated Jul. 26, 2021 in English.
(Continued)

*Primary Examiner* — Bo B Jang
(74) *Attorney, Agent, or Firm* — Collard & Roe, P.C.; William Collard

(57) ABSTRACT

Provided are a display substrate and a display apparatus. The display substrate includes a first display region and a second display region, and a pixel density of the first display region is higher than a pixel density of the second display region. A first pixel circuit of a first sub-pixel in the first display region includes one pixel circuit unit, and a second pixel circuit of a second sub-pixel in the second display region includes two pixel circuit units. The first pixel circuit is configured to be connected with a first power voltage terminal to receive a first power voltage as a pixel power voltage, and the second pixel circuit is configured to be (Continued)

connected with a second power voltage terminal to receive a second power voltage as a pixel power voltage and the first power voltage is different from the second power voltage.

31 Claims, 17 Drawing Sheets

(56) References Cited

U.S. PATENT DOCUMENTS

| | | | |
|---|---|---|---|
| 11,678,546 B2 | 6/2023 | Liu et al. | |
| 11,862,085 B2 | 1/2024 | Zhang et al. | |
| 2019/0130822 A1 | 5/2019 | Jung et al. | |
| 2019/0181209 A1 | 6/2019 | Zhang et al. | |
| 2020/0161400 A1 | 5/2020 | Ka et al. | |
| 2021/0065625 A1 | 3/2021 | Wang et al. | |
| 2021/0343222 A1 | 11/2021 | Hei et al. | |

FOREIGN PATENT DOCUMENTS

| | | | |
|---|---|---|---|
| CN | 108091673 A | 5/2018 |
| CN | 108766347 A | 11/2018 |
| CN | 108922900 A | 11/2018 |
| CN | 109087591 A | 12/2018 |
| CN | 109346009 A | 2/2019 |
| CN | 109637457 A | 4/2019 |
| CN | 110164368 A | 8/2019 |
| CN | 110265448 A | 9/2019 |
| CN | 110265458 A | 9/2019 |
| CN | 110288946 A | 9/2019 |
| CN | 108039148 B | 11/2019 |
| CN | 110459168 A | 11/2019 |
| CN | 110610680 A | 12/2019 |
| CN | 110648622 A | 1/2020 |
| CN | 110675835 A | 1/2020 |
| CN | 110718190 A | 1/2020 |
| CN | 110914891 A | 3/2020 |
| CN | 210136876 U | 3/2020 |
| CN | 111063301 A | 4/2020 |
| CN | 111208679 A | 5/2020 |
| CN | 111292687 A | 6/2020 |
| KR | 10-2004-0079167 A | 9/2004 |

OTHER PUBLICATIONS

Written Opinion of PCT/CN2021/094031 dated Jul. 26, 2021 in Chinese.
Extended European Search Report in European Application No. 21832038.0 dated Apr. 11, 2023.

DISPLAY SUBSTRATE AND DISPLAY APPARATUS

CROSS REFERENCE TO RELATED APPLICATIONS

This application is the National Stage of PCT/CN2021/094031 filed on May 17, 2021, which claims priority under 35 U.S.C. § 119 of Chinese Application No. 202010606709.1 filed on Jun. 29, 2020, the disclosure of which is incorporated by reference.

TECHNICAL FIELD

Embodiments of the present disclosure relate to a display substrate and a display apparatus.

BACKGROUND

In a display field, Organic Light-Emitting Diode (OLED) display panels have wide development prospects due to characteristics such as self-luminescence, high contrast ratio, low energy consumption, wide viewing angle, fast response speed, applicability to flexible panels, wide operating temperature range and simple fabrication. In order to enrich functions of the display panels, components having other functions, such as imaging elements having photosensitive functions, are usually integrated to implement functions such as camera shooting and fingerprint recognition.

SUMMARY

At least an embodiment of the present disclosure provides a display substrate, having a first side for display and a second side opposite to the first side. The display substrate comprises a display region, the display region comprises a plurality of pixel circuit units on a base substrate, the plurality of pixel circuit units are arranged in a plurality of rows and columns along a first direction and a second direction, and the first direction is different from the second direction; each of the plurality of pixel circuit units comprises a drive sub-circuit and a first connection electrode for being connected with a light-emitting element; a first terminal of the drive sub-circuit is configured to receive a pixel power voltage, a second terminal of the drive sub-circuit is configured to be electrically connected with the light-emitting element through the first connection electrode, and the drive sub-circuit of the pixel circuit unit is configured to form a driving current flowing through the light-emitting element in response to the pixel power voltage; the display region comprises a first display region and a second display region; the first display region comprises a plurality of first sub-pixels, each first sub-pixel comprises a first pixel circuit, and the first pixel circuit comprises one pixel circuit unit; the second display region comprises a plurality of second sub-pixels, each second sub-pixel comprises a second pixel circuit, and the second pixel circuit comprises two adjacent pixel circuit units; first connection electrodes of the two pixel circuit units of the each second pixel circuit are electrically connected with each other to be connected to a same light-emitting element; pixel density of the plurality of first sub-pixels in the first display region is higher than pixel density of the plurality of second sub-pixels in the second display region; the display substrate further comprises a first power voltage terminal and a second power voltage terminal, and the first power voltage terminal and the second power voltage terminal are insulated from each other; the first power voltage terminal is configured to be able to output a first power voltage, the second power voltage terminal is configured to be able to output a second power voltage, and the first power voltage is different from the second power voltage; the first pixel circuit is configured to be connected with the first power voltage terminal to receive the first power voltage as the pixel power voltage of the pixel circuit unit of the first pixel circuit, and the second pixel circuit is configured to be connected with the second power voltage terminal to receive the second power voltage as the pixel power voltage of the two pixel circuit units of the second pixel circuit.

In some examples, the display substrate further comprises a plurality of first power lines and a plurality of second power lines extended along the second direction. The plurality of first power lines and the plurality of second power lines are respectively arranged along the first direction; the plurality of first power line and the plurality of second power line are arranged in a same layer and insulated from each other; the plurality of first power lines are electrically connected with the first power voltage terminal and drive sub-circuits of the plurality of first sub-pixels to supply the first power voltage; and the plurality of second power lines are electrically connected with the second power voltage terminal and drive sub-circuits of the plurality of second sub-pixels to supply the second power voltage.

In some examples, the plurality of second power lines are in one-to-one correspondence with the plurality of first power lines; and each second power line and a first power line corresponding to the each second power line are arranged along the second direction and spaced apart from each other.

In some examples, the display substrate further comprises a non-display region and a power wire in the non-display region, and the power wire is arranged around the display region, and electrically connects the second power voltage terminal and the plurality of second power lines.

In some examples, the display substrate further comprises a plurality of third power lines and a plurality of fourth power lines extended along the first direction, and the plurality of third power lines and the plurality of fourth power lines are arranged along the second direction; the plurality of third power lines and the plurality of fourth power lines are arranged in a same layer and insulated from each other, and are located on a side, which is close to the base substrate, of the plurality of first power lines and the plurality of second power lines; the plurality of third power lines are in one-to-one correspondence with the plurality of fourth power lines, and each third power line and a fourth power line corresponding to the each third power line are arranged along the first direction and spaced apart from each other.

In some examples, each third power line is electrically connected with at least one of the plurality of first power lines through at least one first via hole; each fourth power line is electrically connected with at least one of the plurality of second power lines through at least one second via hole.

In some examples, the pixel circuit unit further comprises a data writing sub-circuit, a compensating sub-circuit and a storage sub-circuit; the data writing sub-circuit comprises a control terminal, a first terminal and a second terminal; and the second terminal of the data writing sub-circuit is electrically connected with the drive sub-circuit; the compensating sub-circuit comprises a control terminal, a first terminal and a second terminal; the control terminal of the compensating sub-circuit is configured to receive a scan signal; the first terminal and the second terminal of the compensating sub-circuit are respectively electrically connected with the second terminal and the control terminal of the drive sub-circuit; and the compensating sub-circuit is configured to perform threshold compensation on the drive sub-circuit in response to the scan signal; the storage sub-circuit is electrically connected with the control terminal of the drive sub-circuit and the pixel power voltage terminal; the storage sub-circuit comprises a storage capacitor; the storage capacitor comprises a first capacitor electrode and a second capacitor electrode; the first capacitor electrode is configured to receive the pixel power voltage; and the second capacitor electrode is connected with the control terminal of the drive sub-circuit.

In some examples, the plurality of third power lines are respectively arranged in one-to-one correspondence with the plurality of rows of first pixel circuits; and the plurality of fourth power lines are respectively arranged in one-to-one correspondence with the plurality of rows of second pixel circuits; each third power line is integrally formed with first capacitor electrodes of pixel circuit units of a row of first sub-pixels corresponding to the each third power line; and each fourth power line is integrally formed with first capacitor electrodes of pixel circuit units of a row of second sub-pixels of the each fourth power line.

In some examples, first terminals of data writing sub-circuits of the two pixel circuit units of the second pixel circuit are electrically connected with each other.

In some examples, the second pixel circuit further comprises a second connection electrode, and the second connection electrode electrically connects the first terminals of the data writing sub-circuits of the two pixel circuit units of the second pixel circuit.

In some examples, the second connection electrode is in a same layer as and insulated from the first capacitor electrodes of the two pixel circuit units of the second pixel circuit.

In some examples, the display substrate further comprises a plurality of main data lines and a plurality of auxiliary data lines extended along the second direction, the plurality of main data lines are arranged along the first direction; and the plurality of auxiliary data lines are arranged along the first direction; the plurality of main data lines are electrically connected with first terminals of data sub-circuits of the plurality of columns of pixel circuit units in the first display region in one-to-one correspondence to supply first data signals; the plurality of auxiliary data lines are electrically connected with first terminals of data sub-circuits of the plurality of columns of pixel circuit units in the second display region to supply second data signals; the plurality of auxiliary data lines are in one-to-one correspondence with the plurality of main data lines; and each of the plurality of auxiliary data lines and a main data line corresponding to the each auxiliary data line are arranged in parallel in the second direction.

In some examples, the plurality of main data lines and the plurality of auxiliary data lines are in a same layer and are on a side of the first capacitor electrode away from the base substrate.

In some examples, the plurality of auxiliary data lines are divided into a plurality of data line groups; and each data line group comprises two of the plurality of auxiliary data lines; the plurality of data line groups are respectively electrically connected with the plurality of columns of second pixel circuits in one-to-one correspondence.

In some examples, two second pixel circuits in a same column and in an nth row and an (n+1)th row of the plurality of rows of second pixel circuits form a pixel circuit group, and share one auxiliary data line; n is an odd number or an even number greater than 0.

In some examples, in each column of second pixel circuits along the second direction, a plurality of pixel circuit groups are alternately electrically connected with two auxiliary data lines in a data line group corresponding to the each column of second pixel circuits.

In some examples, two adjacent data line groups comprise four auxiliary data lines, which are respectively a first data line, a second data line, a third data line and a fourth data line sequentially arranged in the first direction; and the first data line is directly electrically connected with its corresponding main data line.

In some examples, the second data line, the third data line, and the fourth data line are respectively arranged in a same layer as and spaced apart from its corresponding main data line.

In some examples, the fourth data line is electrically connected with a main data line corresponding to the second data line through a third connection electrode.

In some examples, the third connection electrode is in a same layer as and insulated from the first connection electrode, and the third connection electrode is at a boundary between the first display region and the second display region.

In some examples, the third data line and the fourth data line are both configured to receive the second data signals from a side, which is away from the first display region in the second direction, of the second display region.

In some examples, the first display region further comprises a plurality of first light-emitting elements, the plurality of first light-emitting elements are respectively electrically connected with the first connection electrodes of the pixel circuit units of the plurality of first pixel circuits in one-to-one correspondence.

In some examples, a count of second pixel circuits in the second display region is X, the second display region further comprises Y second light-emitting elements, the Y second light-emitting elements are electrically connected with Y second pixel circuits among the X second pixel circuits in one-to-one correspondence, X and Y are both positive integers, and Y is less than X; each of the Y second light-emitting elements is electrically connected with each of first connection electrodes of both two pixel circuit units in a second pixel circuit corresponding to the each second light-emitting element.

In some examples, an area of a light-emitting region of at least one of the Y second light-emitting elements is larger than an area of a light-emitting region of a first light-emitting element emitting light of a same color as the at least one second light-emitting element.

In some examples, the display region further comprises a third display region at least partially surrounded by the second display region, and the third display region is configured to allow light to transmit from the first side to the second side for sensing; the third display region comprises Z third light-emitting elements, the Z third light-emitting elements are electrically connected with Z second pixel circuits in the plurality of second sub-pixels in one-to-one correspondence, and Z is a positive integer and Z is less than or equal to X-Y; each third light-emitting element is electrically connected with first connection electrodes of both two pixel circuit units in a second sub-pixel corresponding to the each third light-emitting element.

In some examples, each of the Z third light-emitting elements comprises a first electrode, a second electrode and a light-emitting layer; and the first electrode of each third light-emitting element is closer to the base substrate than the second electrode of the each third light-emitting element; the display substrate further comprises a plurality of fourth connection electrodes; and the plurality of fourth connection electrodes are arranged in one-to-one correspondence with the plurality of third light-emitting elements, each fourth connection electrode electrically connects a first electrode of a third light-emitting element corresponding to the each fourth connection electrode to first connection electrodes of two pixel circuit units corresponding to the third light-emitting element.

In some examples, the plurality of fourth connection electrodes are in the second display region, and are on a side, which is close to the base substrate, of first electrodes of the plurality of third light-emitting elements.

In some examples, the display substrate further comprises a plurality of connection lines, and the plurality of connection lines are extended from the second display region to the third display region, the plurality of connection lines are arranged in one-to-one correspondence with the plurality of fourth connection electrodes and in one-to-one correspondence with the plurality of third light-emitting elements; and a fourth connection electrode corresponding to each of the plurality of connection lines is connected with a first electrode of a third light-emitting element corresponding to the each connection line.

In some examples, the plurality of connection lines and the plurality of fourth connection electrodes are in a same layer; and each of the plurality of connection lines and a fourth connection electrode corresponding to the each connection line are in an integral structure.

At least an embodiment of the present disclosure further provides a display apparatus, comprising the display substrate of any one above display substrate.

In some examples, the display apparatus further comprises a sensor, and the sensor is provided on the second side of the display substrate, and is configured to receive light from the first side of the display substrate.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
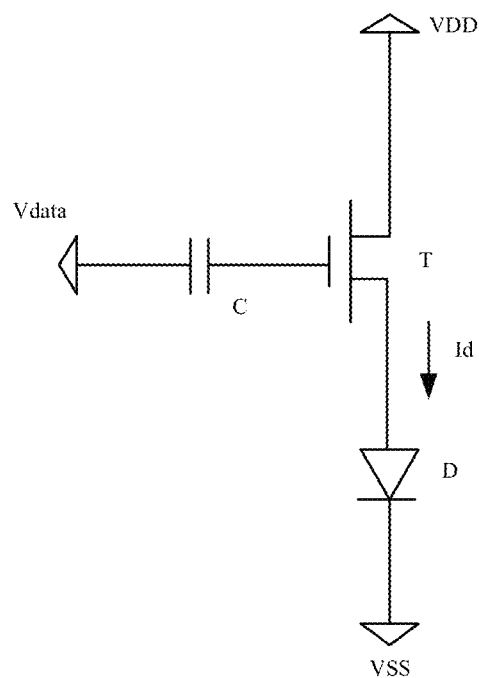
FIG. 1 shows a basic structure of a pixel circuit of a display substrate provided by at least one embodiment of the present disclosure.

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

In a display apparatus integrated with an imaging element, arranging the imaging element in a display region of the display apparatus helps increase a screen-to-body ratio, for example, realize full-screen display. Since a display element is fabricated in the display region, light transmittance of the imaging element could be affected; for example, a light-emitting element, and an opaque trace, etc. in a sub-pixel may prevent imaging element from capturing light, thereby affecting imaging quality. For example, light transmittance of the region where the imaging element is provided may be increased by reducing density of sub-pixels in the region, which, however, reduces display brightness of the region where density of sub-pixels is low, resulting in uneven display.

At least some embodiments of the present disclosure provide a display substrate, having a first side for display and a second side opposite to the first side; the display substrate includes a display region, the display region includes a plurality of pixel circuit units, the plurality of pixel circuit units are arranged in a plurality of rows and columns along a first direction and a second direction; and the first direction is different from the second direction; each of the plurality of pixel circuit units includes a drive sub-circuit and a first connection electrode for being connected with a light-emitting element, the drive sub-circuit has a first terminal configured to receive a pixel power voltage, and a second terminal configured to be electrically connected with the light-emitting element through the first connection electrode, the drive sub-circuit of the pixel circuit unit is configured to form a driving current flowing through the light-emitting element in response to the pixel power voltage; the display region includes a first display region and a second display region, the first display region includes a plurality of first sub-pixels, each first sub-pixel includes a first pixel circuit, the first pixel circuit includes one of the pixel circuit units; the second display region includes a plurality of second sub-pixels, each second sub-pixel includes a second pixel circuit, the second pixel circuit includes two adjacent pixel circuit units, first connection electrodes of two pixel circuit units of the second pixel circuit are electrically connected with each other to be connected to a same light-emitting element; pixel density of the plurality of first sub-pixels in the first display region is higher than pixel density of the plurality of second sub-pixels in the second display region; the display substrate further includes a first power voltage terminal and a second power voltage terminal, the first power voltage terminal and the second power voltage terminal are insulated from each other, the first power voltage terminal is configured to be able to output a first power voltage, the second power voltage terminal is configured to be able to output a second power voltage, the first power voltage is different from the second power voltage; the first pixel circuit is configured to be connected with the first power voltage terminal to receive the first power voltage as a pixel power voltage of a pixel circuit unit of the first pixel circuit, and the second pixel circuit is configured to be connected with the second power voltage terminal to receive the second power voltage as a pixel power voltage of two pixel circuit units of the second pixel circuit.

By arranging two pixel circuit units as a pixel circuit to drive the light-emitting element to emit light in the second display region with lower pixel density, the display substrate provided by the embodiments of the present disclosure can improve light emission brightness of the light-emitting element of the second display region, and meanwhile the pixel power voltage is respectively supplied to the first display region and the second display region, which helps further improve brightness of the second display region, while improving stability of the pixel circuit and reducing power consumption of the circuit.

A basic pixel architecture shown in FIG. 1 includes a drive transistor T, a storage capacitor C and a light-emitting element D; a degree to which a channel of the drive transistor T is turned on controls a current Id flowing through the light-emitting element; a difference between a power voltage VDD and a voltage at a gate node of the drive transistor may control an ON degree of the drive transistor T. For example, in a case where the light-emitting element is an Organic Light-Emitting Diode (OLED), when the drive transistor T operates in a saturation region, the current Id flowing through the OLED is $k/2 (Vdata-VDD)^2$, where, k is an electrical conductivity coefficient of the drive transistor T, Vdata is a written data voltage, and VDD is the power voltage.

For example, circuit simulation results show that, as driven by a same data voltage Vdata and power voltage VDD, driving the OLED jointly by two pixel units may increase a light-emitting current to about 1.8 times the light-emitting current when one pixel unit drives an OLED to emit light.

Meanwhile, an inventor finds that although adopting two pixel circuit units to drive the light-emitting element may increase the light-emitting current, yet it also increases a voltage difference VEL across the light-emitting element, thereby reducing a source-drain voltage difference Vds of the drive transistor T, resulting in changes in an operating state of the drive transistor T, for example, entering from a saturation region to a linear region, which will reduce stability of the light-emitting current, thereby reducing light emission stability of the light-emitting element, and further reducing stability of display. The embodiments of the present disclosure can effectively solve the problem by respectively providing the pixel power voltage VDD to the first display region, so that the pixel power voltage VDD of the second display region can be separately controlled. According to a voltage formula VDD−VSS=Vds+VEL, it can be known that, a source-drain voltage difference Vds of the drive transistor T may be adjusted by increasing a voltage difference between VDD and VSS. For example, the pixel power voltage VDD of the second display region may be increased as required, so as to increase the light-emitting current while keeping the operation region of the drive transistor in the saturation region, so that light emission stability of the light-emitting element is not affected. In addition, influence on power consumption of the display apparatus can also be reduced by respectively supplying the power voltage VDD to the first display region and the second display region.

It should be noted that, the pixel density according to the present disclosure refers to the number of sub-pixels per unit area, for example, the number of light-emitting elements or the number of pixel circuits per unit area, and each pixel circuit is configured to be electrically connected with one light-emitting element.

Figure 2A:
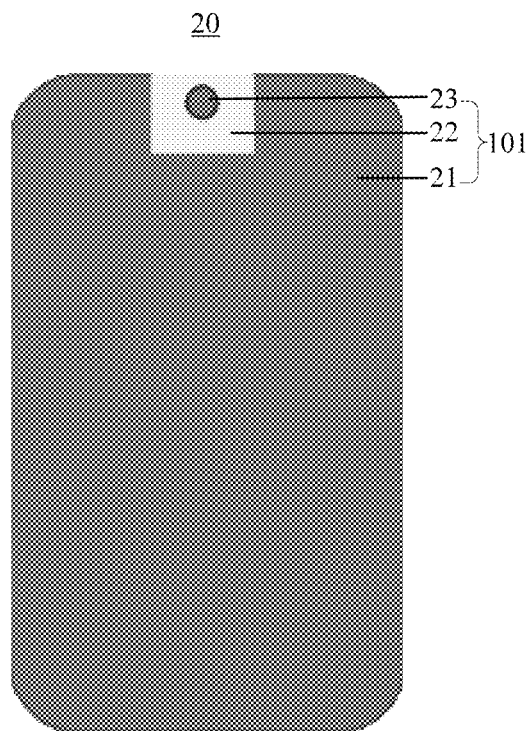
FIG. 2A is a first schematic diagram of a display substrate provided by at least one embodiment of the present disclosure.

FIG. 2A is a first schematic plan view of the display substrate provided by the embodiment of the present disclosure, and FIG. 2A shows layout of the display region of the display substrate. As shown in FIG. 2A, the display substrate 20 includes a display region 101, the display region 101 includes a first display region 21 and a second display region 22, the second display region 22 may be located inside the first display region 21 and be surrounded by the first display region 21; and the second display region 22 may also be located outside the first display region 21, for example, it is half-surrounded by the first display region 21. As shown in FIG. 2A, the display region 101 may further include a third display region 23 located in the second display region 22, and the third display region 23 is completely surrounded by the second display region 22, that is, each side of the third display region 23 is provided with sub-pixels in the second display region. In other examples, the second display region may also at least partially surround the third display region. A non-display region of the display substrate is not shown in FIG. 2A.

Figure 2B:
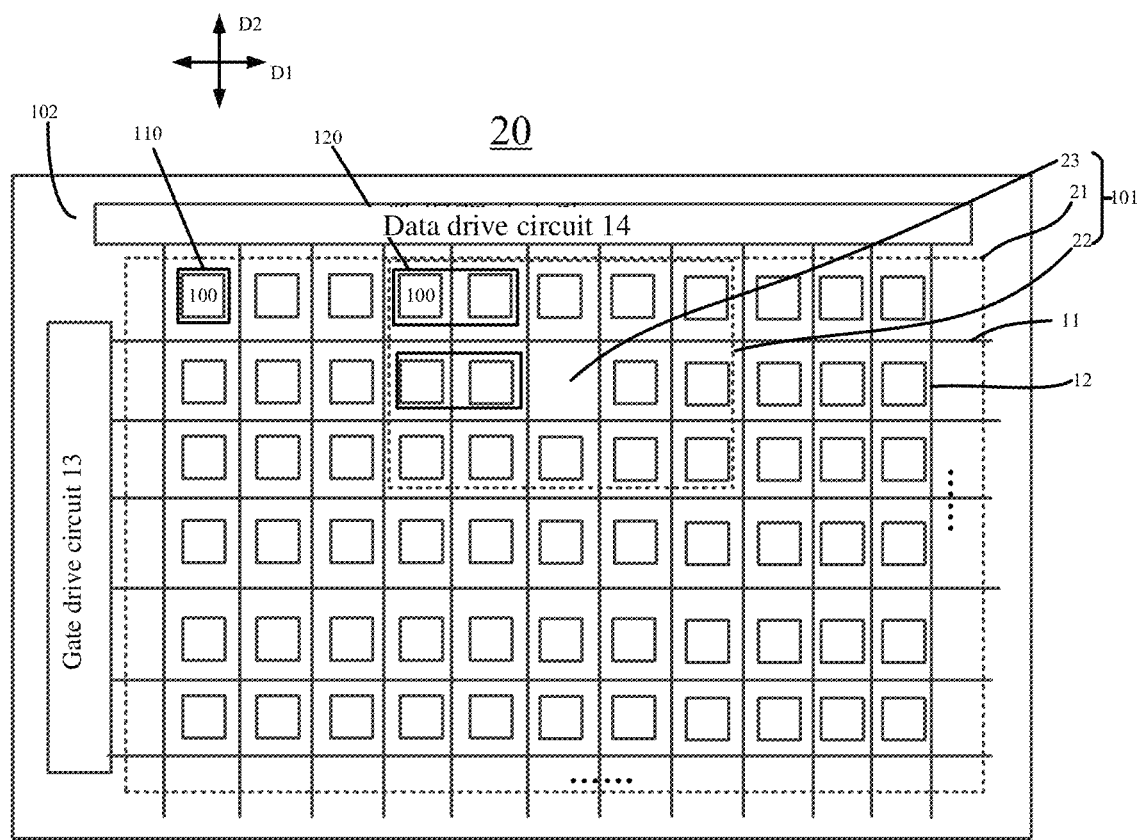
FIG. 2B is a second schematic diagram of a display substrate provided by at least one embodiment of the present disclosure.

FIG. 2B is a second schematic plan view of the display substrate provided by the embodiment of the present disclosure, and FIG. 2B shows a pixel layout diagram of the display substrate. As shown in FIG. 2B, the display substrate 20 includes a plurality of pixel circuit units 100 in the display region 101, the plurality of pixel circuit units 100 are arranged in a plurality of rows and columns along a first direction D1 and a second direction D2; the first direction D1 is different from the second direction D2, for example, they are orthogonal. For example, the pixel rows and the pixel columns do not necessarily extend strictly along a straight line, but may also extend along a curved line (e.g., a broken line), and the curved line generally respectively extends along the first direction D1 or the second direction D2. For example, density of pixel circuit units in the first display region 21 and density of pixel circuit units 22 in the second display region are the same to improve process uniformity.

As shown in FIG. 2B, the display substrate includes a plurality of gate lines 11 and a plurality of data lines 12. For example, the gate line 11 extends along the first direction D1; and the data line 12 extends along the second direction D2. FIG. 2B only illustrates approximate positional relationship of the gate line 11, the data line 12 and the pixel circuit unit 100 in the display substrate, which may be specifically designed according to actual needs. Although FIG. 2B shows that each gate line 11 and each data line 12 run through the first display region 21 and the second display region 22, this is only for convenience of drawing, and is not intended to limit the present disclosure.

For example, each pixel circuit unit 100 includes a 2T1C (i.e., two transistors and one capacitor) pixel circuit, a 4T2C, 5T1C, 7T1C, or nTmC (n, m are positive integers) pixel circuit. For example, in different embodiments, the pixel circuit unit 100 may further include a compensating sub-circuit; the compensating sub-circuit includes an internal compensating sub-circuit or an external compensating sub-circuit; and the compensating sub-circuit may include transistors, capacitors, and so on. For example, as required, the pixel circuit may further include a reset circuit, a light emission control sub-circuit, a detecting circuit, and so on. For example, as shown in FIG. 2B, the display substrate 20 includes a non-display region 102 located outside the display region 101. The display substrate may further include a gate drive circuit 13 and a data drive circuit 14 located in the non-display region. The gate drive circuit 13 is connected with the pixel circuit unit 100 through the gate line 11 to supply various scan signals; and the data drive circuit 14 is connected with the pixel circuit unit 100 through the data line 12 to supply data signals.

Each pixel circuit unit 100 includes a drive sub-circuit and a first connection electrode for being connected with the light-emitting element; the drive sub-circuit has a first terminal configured to receive the pixel power voltage, and a second terminal configured to be electrically connected with the light-emitting element through the first connection electrode; the drive sub-circuit of the pixel circuit unit is configured to form a driving current flowing through the light-emitting element in response to the pixel power voltage; and the drive sub-circuit will be specifically described later in conjunction with the pixel circuit.

As shown in FIG. 2B, the first display region 21 includes a plurality of first sub-pixels; each first sub-pixel includes a first pixel circuit 110; and the first pixel circuit 110 includes one pixel circuit unit 100, that is, consists of one pixel unit 100. The second display region 22 includes a plurality of second sub-pixels; each second sub-pixel includes a second pixel circuit 120; and the second pixel circuit 120 includes two adjacent pixel circuit units 100, for example, the two pixel circuit units 100 are adjacent in the first direction D1. First connection electrodes of the two pixel circuit units 100 of the second pixel circuit are electrically connected with each other to be connected to a same light-emitting element, that is, the two pixel circuit units 100 are connected to a same pixel electrode to jointly drive the same light-emitting element to emit light. Since in the second display region 22, two pixel circuit units 100 jointly drive one same light-emitting element, pixel density in the second display region is low, distribution density of light-emitting elements is also low, and therefore, light transmittance of the second display region is higher than that of the first display region.

FIG. 2B also schematically shows the third display region 23; as shown in FIG. 2B, the third display region 23 is provided with no pixel circuit unit 100, thereby improving light transmittance of the third display region 23. When a photosensitive element is provided on a side of the display substrate that is opposite to the display side, light to be detected reaches the photosensitive element mainly via the third display region 23, which will be described in detail later.

Figure 2C:
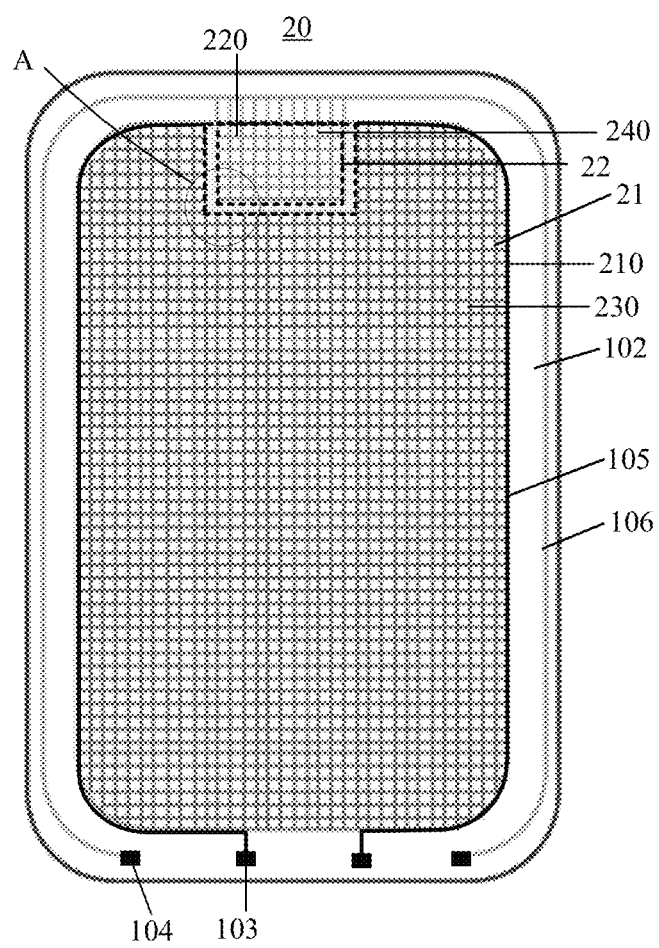
FIG. 2C is a third schematic diagram of a display substrate provided by at least one embodiment of the present disclosure.

FIG. 2C is a third schematic plan view of the display substrate provided by the embodiment of the present disclosure, and FIG. 2C shows a layout diagram of a power line of the display substrate. For clarity, the third display region 23 is omitted in FIG. 2C. The display substrate 20 further includes a first power voltage terminal 103 and a second power voltage terminal 104 located in the non-display region 102; the first power voltage terminal 103 and the second power voltage terminal 104 are insulated from each other; the first power voltage terminal 104 is configured to be able to output the first power voltage VDD1; the second power voltage terminal 104 is configured to be able to output the second power voltage VDD2; and the first power voltage VDD1 is different from the second power voltage VDD2. The first pixel circuit 110 is configured to be connected with the first power voltage terminal 103 to receive the first power voltage VDD1 as a pixel power voltage of the pixel circuit unit 100 of the first pixel circuit 110. The second pixel circuit 120 is configured to be connected with the second power voltage terminal 104 to receive the second power voltage VDD2 as a pixel power voltage of the two pixel circuit units 100 of the second pixel circuit 120. Drive sub-circuits in the two pixel circuit units 100 in the second pixel circuit 120 are both configured to receive the second power voltage VDD2 to drive the light-emitting element to emit light.

The display substrate 20 further includes a first power line 210 and a second power line 220. The first power line 210 is configured to supply a first power voltage VDD1 to the first sub-pixels in the first display region 21; and the second power line 220 is configured to supply a second power voltage VDD2 to the second sub-pixels in the second display region 22.

As shown in FIG. 2C, a plurality of first power lines 210 and a plurality of second power lines 220 respectively extend along the second direction D2; and the plurality of first power lines 210 and the plurality of second power lines 220 are respectively arranged along the first direction D1. For example, as shown in FIG. 2C, the plurality of first power lines 210 are located in the first display region 21, and the plurality of second power lines 220 are located in the second display region 22. For example, the first power line 210 and the second power line 220 are arranged in a same layer and insulated from each other. For example, the plurality of second power lines 220 are in one-to-one correspondence with the plurality of first power lines 210; and each second power line 220 and a corresponding first power line 210 are arranged in parallel in the second direction D2 and spaced apart from each other. In FIG. 2C, a boundary region between the first display region 21 and the second display region 22 is shown by a dotted line; each second power line 220 and a corresponding first power line 210 are on one dummy trace; and the dummy trace is disconnected at the boundary region.

For example, the plurality of first power lines 210 are electrically connected with the first power voltage terminal 103 and are connected with drive sub-circuits of the plurality of first pixel circuits to supply the first power voltage VDD1; and the plurality of second power lines are electrically connected with the second power voltage terminal 104 and are connected with drive sub-circuits of the plurality of second sub-pixels to supply the second power voltage VDD2.

For example, as shown in FIG. 2C, the display substrate 20 further includes a first power wire 105 and a second power wire 106 located in the non-display region 102. The first power wire 105 electrically connects the first power voltage terminal 103 and the plurality of first power lines 210; and the second power wire 106 electrically connects the second power voltage terminal 104 and the plurality of second power lines 220. For example, as shown in FIG. 2C, the first power wire 105 and the second power wire 106 are both arranged around the display region 101; and the first power wire 105 is closer to the display region 101 than the second power wire 106. For example, the second power wire 106 is led out from the second power voltage terminal 104 on a lower side of the first display region 21, extended along left and right sides of the first display region 21, and accesses the second display region 22 from an upper side of the display region (a side opposite to the first power voltage terminal and the second power voltage terminal).

For example, as shown in FIG. 2C, the display substrate 20 further includes a third power line 230 and a fourth power line 240. The third power line 230 is configured to supply the first power voltage VDD1 to the first sub-pixel in the first display region 21; and the fourth power line 240 is configured to supply the second power voltage VDD2 to the second sub-pixel in the second display region 22.

As shown in FIG. 2C, the plurality of third power lines 230 and the plurality of fourth power lines 240 respectively extend along the first direction D1; and the plurality of third power lines 230 and the plurality of fourth power lines 240 are respectively arranged along the second direction D2. For example, as shown in FIG. 2C, the plurality of third power lines 230 are located in the first display region 21; and the plurality of fourth power lines 240 are located in the second display region 22. For example, the third power line 230 and the fourth power line 240 are arranged in a same layer and insulated from each other, for example, located on a side of the first power line 210 and the second power line 220 that is close to the base substrate. For example, as shown in FIG. 2C, the plurality of third power lines 230 are in one-to-one correspondence with the plurality of fourth power lines 240; and each third power line 230 and a corresponding fourth power line 240 are arranged in parallel in the first direction D1 and spaced from each other. Each third power line 230 and a corresponding fourth power line 240 are located on one dummy trace; and the dummy trace is disconnected at the boundary region.

For example, each third power line 230 is electrically connected with at least one of the plurality of first power lines 210 through at least one via hole (not shown), so that the third power lines 230 and the first power lines 210 are interwoven into a mesh structure; and each fourth power line 240 is electrically connected with at least one of the plurality of second power lines 220 through at least one via hole (not shown), so that the fourth power lines 240 and the second power lines 220 are interwoven into a mesh structure. Such a structure helps reduce resistance of the power line, thereby reducing voltage drop on the power line, and helps uniformly deliver the power voltage to the respective sub-pixels, thereby improving uniformity of the display substrate.

For example, the display substrate 20 may further include a control circuit (not shown). For example, the control circuit is configured to control a data drive circuit 14 to apply the data signal, and to control a gate drive sub-circuit to apply the scan signal. An example of the control circuit is a timing control circuit (T-con). The control circuit may be in various forms, including, for example, a processor and a memory; the memory includes executable code; and the processor may run the executable code to execute the above-described detection method.

For example, the processor may be a Central Processing Unit (CPU) or other form of processing apparatus having data processing capabilities and/or instruction execution capabilities, which may include, for example, a microprocessor, a Programmable Logic Controller (PLC), or the like.

For example, a storage apparatus may include one or more computer program products; the computer program products may include various forms of computer readable storage media, for example, a volatile memory and/or a non-volatile memory. The volatile memory may include, for example, a Random Access Memory (RAM) and/or a cache, or the like. The non-volatile memory may include, for example, a Read Only Memory (ROM), a hard disk, a flash memory, or the like. One or more computer program instructions may be stored on the computer readable storage medium; and the processor may run functions desired by the program instructions. Various applications and various data may also be stored on the computer readable storage medium.

The pixel circuit may include a drive sub-circuit, a data writing sub-circuit, a compensating sub-circuit and a storage sub-circuit, and may also include a light emission control sub-circuit, a reset circuit, etc. as required.

Figure 3A:
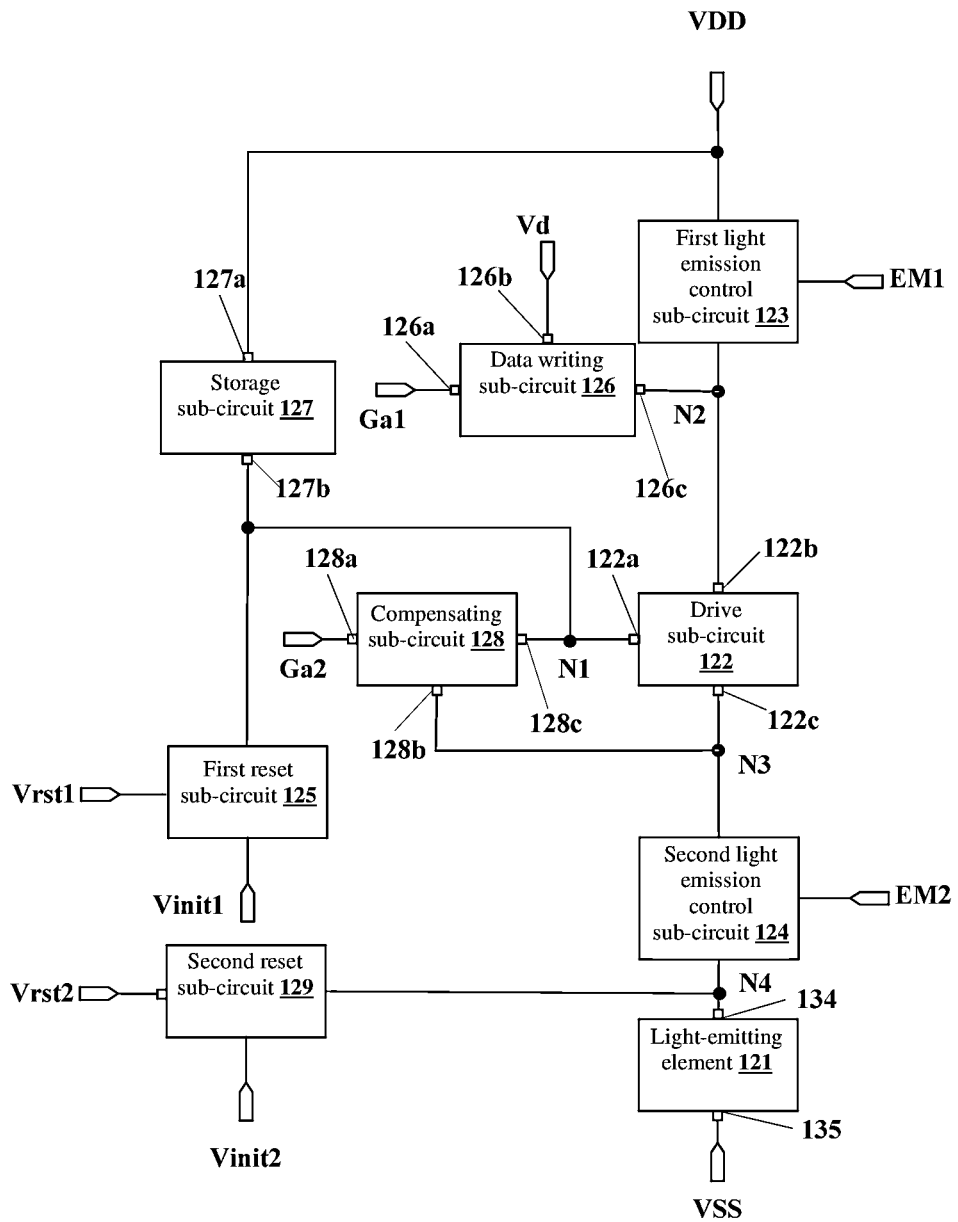
FIG. 3A is a schematic diagram of a pixel circuit unit provided by at least one embodiment of the present disclosure.

FIG. 3A shows a schematic diagram of a circuit of a pixel circuit unit 100 provided by at least one embodiment of the present disclosure.

As shown in FIG. 3A, the pixel circuit unit 100 includes a drive sub-circuit 122, a compensating sub-circuit 128, a data writing sub-circuit 126, a storage sub-circuit 127, a first light emission control sub-circuit 123, a second light emission control sub-circuit 124, a first reset sub-circuit 125 and a second reset sub-circuit 129.

For example, the drive sub-circuit 122 includes a control terminal 122a, a first terminal 122b and a second terminal 122c, and is configured to be connected with the light-emitting element 121 and to control a driving current flowing through the light-emitting element 121. The control terminal 122a of the drive sub-circuit 122 is connected with a first node N1; the first terminal 122b of the drive sub-circuit 122 is connected with a second node N2 and is configured to receive the pixel power voltage VDD; and the second terminal 122c of the drive sub-circuit 122 is connected with a third node N3.

For example, the data writing sub-circuit 126 includes a control terminal 126a, a first terminal 126b and a second terminal 126c; the control terminal 126a is configured to receive a first scan signal Ga1; the first terminal 126b is configured to receive a data signal Vd; and the second terminal 126c is connected with the first terminal 122b (i.e., the second node N2) of the drive sub-circuit 122. The data writing sub-circuit 126 is configured to write the data signal Vd to the first terminal 122b of the drive sub-circuit 122 in response to the first scan signal Ga1. For example, the first terminal 126b of the data writing sub-circuit 126 is connected with the data line 12 to receive the data signal Vd; and the control terminal 126a is connected with the gate line 11 as a scan line to receive the first scan signal Ga1. For example, in a data writing and compensation stage, the data writing sub-circuit 126 may be turned on in response to the first scan signal Ga1, so as to write the data signal into the first terminal 122b (the second node N2) of the drive sub-circuit 122, and store the data signal in the storage sub-circuit 127, so that the driving current for driving the light-emitting element 121 to emit light may be generated according to the data signal, for example, in a light emitting stage.

For example, the compensating sub-circuit 128 includes a control terminal 128a, a first terminal 128b and a second terminal 128c; the control terminal 128a of the compensating sub-circuit 128 is configured to receive a second scan signal Ga2; the first terminal 128b and the second terminal 128c of the compensating sub-circuit 128 are respectively electrically connected with the second terminal 122c and the control terminal 122a of the drive sub-circuit 122; and the compensating sub-circuit 128 is configured to perform threshold compensation on the drive sub-circuit 122 in response to the second scan signal Ga2.

For example, the first scan signal Ga1 may be the same as the second scan signal Ga2. For example, the first scan signal Ga1 and the second scan signal Ga2 may be connected to a same signal output terminal. For example, the first scan signal Ga1 and the second scan signal Ga2 may be transmitted through a same scan line.

In other examples, the first scan signal Ga1 may also be different from the second scan signal Ga2. For example, the first scan signal Ga1 and the second scan signal Ga2 may be connected to different signal output terminals. For example, the first scan signal Ga1 and the second scan signal Ga2 may be respectively transmitted through different scan lines.

For example, the storage sub-circuit 127 includes a first terminal 127a and a second terminal 127b; the first terminal 127a of the storage sub-circuit is configured to receive the pixel power voltage VDD; and the second terminal 127b of the storage sub-circuit is electrically connected with the control terminal 122a of the drive sub-circuit. For example, in the data writing and compensation stage, the compensating sub-circuit 128 may be turned on in response to the second scan signal Ga2, so that the data signal written by the data writing sub-circuit 126 may be stored in the storage sub-circuit 127; meanwhile, the compensating sub-circuit 128 may electrically connect the control terminal 122a and the second terminal 122c of the drive sub-circuit 122, so that relevant information of the threshold voltage of the drive sub-circuit 122 may also be stored accordingly in the storage sub-circuit, and thus, for example, in the light emitting stage, the stored data signal and threshold voltage may be used to control the drive sub-circuit 122, so as to compensate for the output of the drive sub-circuit 122.

For example, the storage sub-circuit 127 is electrically connected with the control terminal 122a of the drive sub-circuit 122 and the pixel power voltage terminal VDD, and is configured to store the data signal written by the data writing sub-circuit 126. For the pixel circuit unit of the first pixel circuit 110 located in the first display region 21, the pixel power voltage terminal VDD is the first power voltage terminal 103; for the pixel circuit unit of the second pixel circuit 120 located in the second display region 22, the pixel power voltage terminal VDD is the second power voltage terminal 104. For example, in the data writing and compensation stage, the compensating sub-circuit 128 may be turned on in response to the second scan signal Ga2, so that the data signal written by the data writing sub-circuit 126 may be stored in the storage sub-circuit 127. For example, in the data writing and compensation stage, the compensating sub-circuit 128 may electrically connect the control terminal 122a and the second terminal 122c of the drive sub-circuit 122, so that relevant information of the threshold voltage of the drive sub-circuit 122 may also be stored accordingly in the storage sub-circuit, and thus, for example, in the light emitting stage, the stored data signal and threshold voltage may be used to control the drive sub-circuit 122, so as to compensate for output of the drive sub-circuit 122.

For example, the first light emission control sub-circuit 123 is connected with the first terminal 122b (the second node N2) of the drive sub-circuit 122 and the first voltage terminal VDD, and is configured to apply the first power voltage from the first voltage terminal VDD to the first terminal 122b of the drive sub-circuit 122 in response to a first light emission control signal EM1. For example, as shown in FIG. 3A, the first light emission control sub-circuit 123 is connected with a first light emission control terminal EM1, the first voltage terminal VDD and the second node N2.

For example, the second light emission control sub-circuit 124 is connected with a second light emission control terminal EM2, the first terminal 134 of the light-emitting element 121 and the second terminal 122c of the drive sub-circuit 122, and is configured to cause the driving current to be applied to the light-emitting element 121 in response to a second light emission control signal.

For example, in the light emitting stage, the second light emission control sub-circuit 123 is turned on in response to the second light emission control signal EM2 supplied by the second light emission control terminal EM2, so that the drive sub-circuit 122 may be electrically connected with the light-emitting element 121 through the second light emission control sub-circuit 123, so as to drive the light-emitting element 121 to emit light under control of the driving current; and in a non-light emitting stage, the second light emission control sub-circuit 123 is turned off in response to the second light emission control signal EM2, so as to avoid a current flowing through the light-emitting element 121 and causing the same to emit light, which can improve a contrast ratio of a corresponding display apparatus.

For another example, in an initialization stage, the second light emission control sub-circuit 124 may also be turned on in response to the second light emission control signal EM2, so that a reset operation may be performed on the drive sub-circuit 122 and the light-emitting element 121 in combination with the reset circuit.

For example, the second light emission control signal EM2 may be the same as the first light emission control signal EM1, for example, the second light emission control signal EM2 may be connected to a same signal output terminal as the first light emission control signal EM, for example, the second light emission control signal EM2 may be transmitted through a same light emission control line as the first light emission control signal EM1.

In other examples, the second light emission control signal EM2 may be different from the first light emission control signal EM1. For example, the second light emission control signal EM2 and the first light emission control signal EM1 may be respectively connected to different signal output terminals. For example, the second light emission control signal EM2 and the first light emission control signal EM1 may be respectively transmitted through different light emission control lines.

For example, the first reset sub-circuit 125 is connected with a first reset voltage terminal Vinit1 and the control terminal 122a (the first node N1) of the drive sub-circuit 122, and is configured to apply a first reset voltage Vinit1 to the control terminal 122a of the drive sub-circuit 122 in response to a first reset control signal Rst1.

For example, the second reset sub-circuit 129 is connected with a second reset voltage terminal Vinit2 and the first terminal 122b (a fourth node N4) of the light-emitting element 122, and is configured to apply a second reset voltage Vinit2 to the first terminal 134 of the light-emitting element 121 in response to the second reset control signal Rst2.

For example, the first reset sub-circuit 125 and the second reset sub-circuit 129 may be turned on respectively in response to the first reset control signal Rst1 and the second reset control signal Rst2, so that the second reset voltage Vinit2 may be applied to the first node N1, and the first reset voltage Vinit1 may be applied to the first terminal 134 of the light-emitting element 121 respectively, and thus the drive sub-circuit 122, the compensating sub-circuit 128 and the light-emitting element 121 may be reset to eliminate influence of the previous light emitting stage.

For example, the second reset control signal Rst2 and the first scan signal Ga1 for each row of sub-pixels may be the same; and the two may be transmitted through a same gate line 11. For example, a first reset control signal Rst1 of each row of sub-pixels may be a same signal as a first scan signal Ga1 of a previous row of sub-pixels; and the two may be transmitted through a same gate line 11.

For example, the light-emitting element 121 includes a first terminal 134 and a second terminal 135; the first terminal 134 of the light-emitting element 121 is configured to be connected with the second terminal 122c of the drive sub-circuit 122; and the second terminal 135 of the light-emitting element 121 is configured to be connected with the second voltage terminal VSS. For example, in one example, as shown in FIG. 3A, the first terminal 134 of the light-emitting element 121 may be connected to the fourth node N4 through the second light emission control sub-circuit 124. The embodiments of the present disclosure include, but are not limited to, this situation.

It should be noted that, in the description of the embodiments of the present disclosure, the first node N1, the second node N2, the third node N3 and the fourth node N4 do not necessarily represent actual components, but represent a meeting point of related circuit connections in the circuit diagram.

It should be noted that, in the description of the embodiments of the present disclosure, the symbol Vd may not only represent the data signal terminal, but also represent a level of the data signal; similarly, the symbols Ga1 and Ga2 may not only represent the first scan signal and the second scan signal, but also represent the first scan signal terminal and the second scan signal terminal; Rst may not only represent the reset control terminal, but also represent the reset control signal; the symbols Vinit1 and Vinit2 may not only represent the first reset voltage terminal and the second reset voltage terminal, but also represent the first reset voltage and the second reset voltage; the symbol VDD may not only represent the pixel power voltage, but also represent the pixel power voltage terminal; and the symbol VSS may not only represent a common power voltage terminal, but also represent a common power voltage. The following respective embodiments are the same, and no details will be repeated here.

Figure 3B:
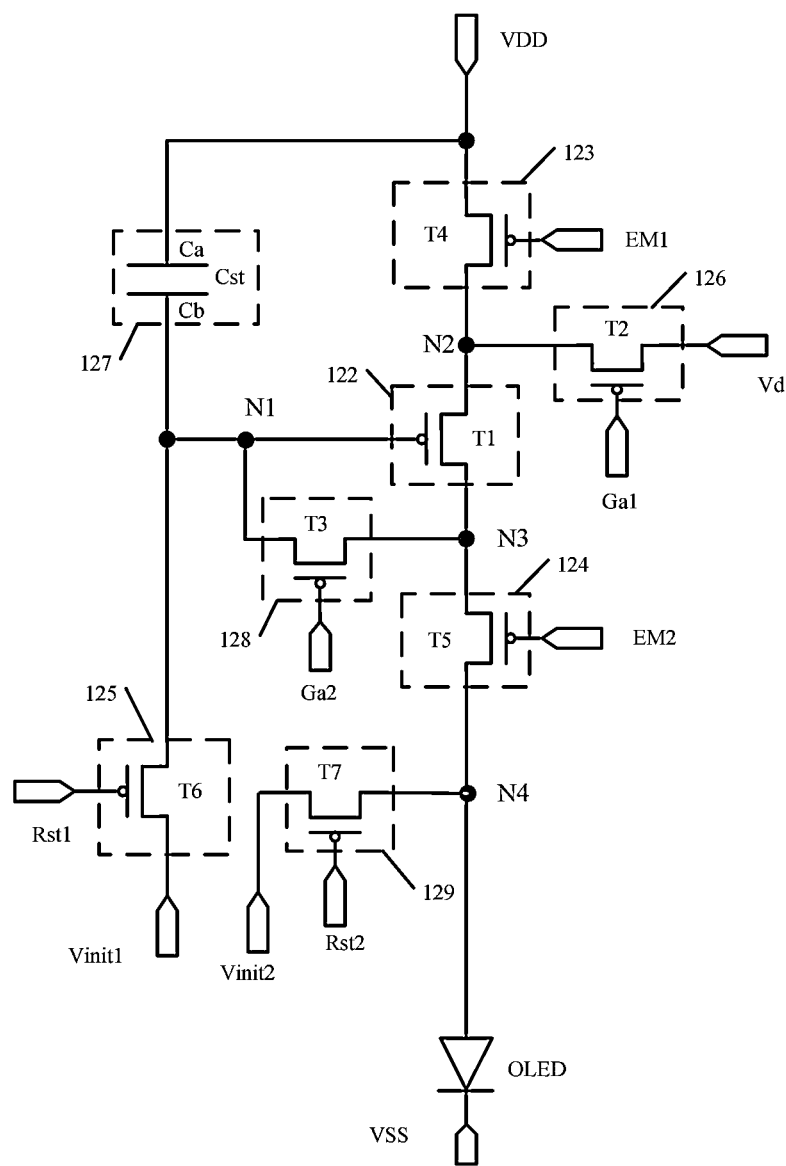
FIG. 3B is a circuit diagram of a specific implementation example of the pixel circuit unit shown in FIG. 3A.

FIG. 3B is a circuit diagram of a specific implementation example of the pixel circuit shown in FIG. 3A. As shown in FIG. 3B, the pixel circuit includes first to seventh transistors T1, T2, T3, T4, T5, T6, T7 and includes a storage capacitor Cst. For example, the first transistor T1 is used as a drive transistor, and the other second to seventh transistors are used as switching transistors.

For example, as shown in FIG. 3B, the drive sub-circuit 122 may be implemented as the first transistor T1. A gate electrode of the first transistor T1 serves as the control terminal 122a of the drive sub-circuit 122 and is connected with the first node N1; a first electrode of the first transistor T1 serves as the first terminal 122b of the drive sub-circuit 122 and is connected with the second node N2; and a second electrode of the first transistor T1 serves as the second terminal 122c of the drive sub-circuit 122, and is connected with the third node N3.

For example, as shown in FIG. 3B, a data writing sub-circuit 126 may be implemented as the second transistor T2. A gate electrode of the second transistor T2 is connected with a first scan line (a first scan signal terminal Ga1) to receive the first scan signal; a first electrode of the second transistor T2 is connected with the data line (the data signal terminal Vd) to receive the data signal; and a second electrode of the second transistor T2 is connected with the first terminal 122b (the second node N2) of the drive sub-circuit 122.

For example, as shown in FIG. 3B, the compensating sub-circuit 128 may be implemented as the third transistor T3. A gate electrode, a first electrode and a second electrode of the third transistor T3 respectively serve as a control electrode 128a, a first electrode 128b and a second electrode 128c of the compensating sub-circuit. The gate electrode of the third transistor T3 is configured to be connected with a second scan line (a second scan signal terminal Ga2) to receive the second scan signal; the first electrode T3s of the third transistor T3 is connected with the second electrode T1d (the third node N3) of the first transistor T1; and the second electrode T3d of the third transistor T3 is electrically connected with the gate electrode T1g (the first node N1) of the first transistor T1. For example, as shown in FIG. 3B, the storage sub-circuit 127 may be implemented as the storage capacitor Cst; the storage capacitor Cst includes a first capacitor electrode Ca and a second capacitor electrode Cb; the first capacitor electrode Ca is electrically connected with the pixel power voltage terminal VDD; and the second capacitor electrode Cb is electrically connected with the gate electrode T1g (the first node N1) of the first transistor T1.

For example, as shown in FIG. 3B, the first light emission control sub-circuit 123 may be implemented as the fourth transistor T4. A gate electrode of the fourth transistor T4 is connected with a first light emission control line (the first light emission control terminal EM1) to receive a first light emission control signal; a first electrode of the fourth transistor T4 is connected with the first voltage terminal VDD to receive the first power voltage; and a second electrode of the fourth transistor T4 is connected with the first terminal 122b (the second node N2) of the drive sub-circuit 122.

For example, the light-emitting element 121 is embodied as a Light Emitting Diode (LED), which may be, for example, an Organic Light Emitting Diode (OLED), a Quantum Dot Light Emitting Diode (QLED), or an inorganic light emitting diode, which may be, for example, a Micro Light Emitting Diode (Micro LED) or a micro OLED. For example, the light-emitting element 121 may be a top emission structure, a bottom emission structure, or a double-sided emission structure. The light-emitting element 121 may emit red light, green light, blue light or white light, etc. A specific structure of the light-emitting element will not be limited by the embodiments of the present disclosure.

For example, a first electrode 134 (e.g. an anode) of the light-emitting element 121 is connected with the fourth node N4 and is configured to be connected with the second terminal 122c of the drive sub-circuit 122 through the second light emission control sub-circuit 124; and a second electrode 135 (e.g., a cathode) of the light-emitting element 121 is configured to be connected with the common power voltage terminal VSS to receive the common power voltage VSS; and the current flowing into the light-emitting element 121 from the second terminal 122c of the drive sub-circuit 122 determines brightness of the light-emitting element. For example, the common power voltage terminal VSS may be grounded, that is, VSS may be 0 V. For example, the common power voltage VSS may be a negative voltage.

For example, the second light emission control sub-circuit 124 may be implemented as the fifth transistor T5. A gate electrode of the fifth transistor T5 is connected with a second light emission control line (the second light emission control terminal EM2) to receive the second light emission control signal; a first electrode of the fifth transistor T5 is connected with the second terminal 122c (the third node N3) of the drive sub-circuit 122; and a second electrode of the fifth transistor T5 is connected with the first terminal 134 (the fourth node N4) of the light-emitting element 121.

For example, the first reset sub-circuit 125 may be implemented as the sixth transistor T6; and the second reset sub-circuit may be implemented as the seventh transistor T7. A gate electrode of the sixth transistor T6 is configured to be connected with a first reset control terminal Rst1 to receive the first reset control signal Rst1; a first electrode of the sixth transistor T6 is connected with the first reset voltage terminal Vinit1 to receive the first reset voltage Vinit1; and a second electrode of the sixth transistor T6 is configured to be connected with the first node N1. A gate electrode of the seventh transistor T7 is configured to be connected with a second reset control terminal Rst2 to receive the second reset control signal Rst2; a first electrode of the seventh transistor T7 is connected with the second reset voltage terminal Vinit2 to receive the second reset voltage Vinit2; and a second electrode of the seventh transistor T7 is configured to be connected with the fourth node N4.

It should be noted that, the transistors adopted in the embodiments of the present disclosure may all be thin film transistors, field effect transistors, or other switching devices with same characteristics; and the thin film transistors are taken as examples for description in the embodiments of the present disclosure. A source electrode and a drain electrode of the transistor adopted here may be symmetrical in structure, so the source electrode and the drain electrode of the transistor may be structurally indistinguishable. In the embodiments of the present disclosure, in order to distinguish two electrodes of a transistor other than a gate electrode, one electrode is directly described as a first electrode, and the other electrode as a second electrode.

In addition, a transistor may be categorized into an N-type transistor or a P-type transistor according to characteristics of the transistor. When a transistor is a P-type transistor, an On voltage is a low-level voltage (e.g., 0 V, −5 V, −10 V or other suitable voltage), and an OFF voltage is a high-level voltage (e.g., 5 V, 10 V or other suitable voltage)); when the transistor is an N-type transistor, an ON voltage is a high-level voltage (e.g., 5 V, 10 V or other suitable voltage), and an OFF voltage is a low-level voltage (e.g., 0 V, −5 V, −10 V or other suitable voltage). For example, as shown in FIG. 3B, the first to seventh transistors T1 to T7 are all P-type transistors, for example, low temperature polysilicon thin film transistors. However, the type of the transistor will not be limited by the embodiments of the present disclosure, and when the type of the transistor changes, connection relationship in the circuit may be adjusted accordingly.

It may be understood that, the circuit diagram of the pixel circuit unit 100 is the circuit diagram of the first pixel circuit of the first sub-pixel 110.

Figure 3C:
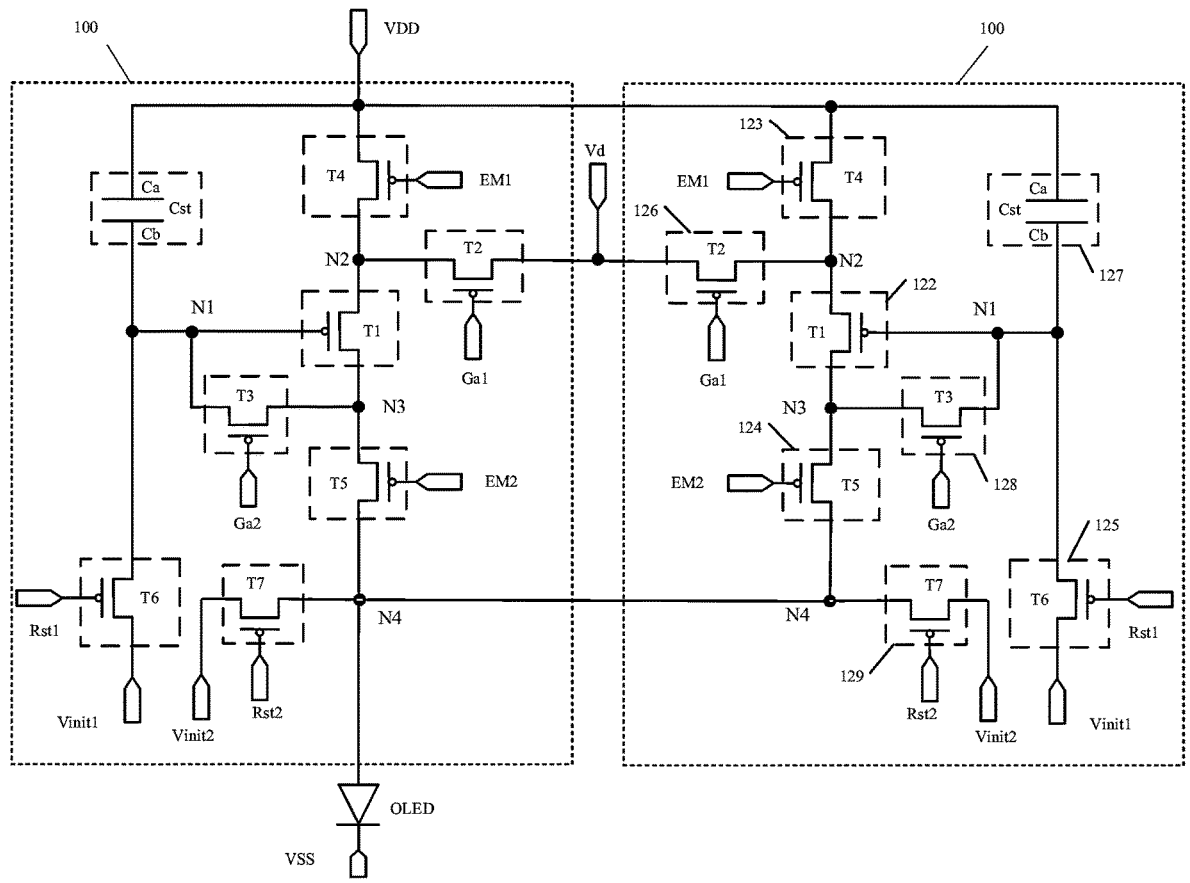
FIG. 3C is a schematic diagram of a second pixel circuit provided by at least one embodiment of the present disclosure.

FIG. 3C shows a circuit diagram of the second pixel circuit 120 of the second sub-pixel. As shown in FIG. 3C, the second pixel circuit is composed of two pixel circuit units 100; and fourth nodes of the two pixel circuit units 100 are electrically connected with each other and connected to a same light-emitting element 121.

Figure 3D:
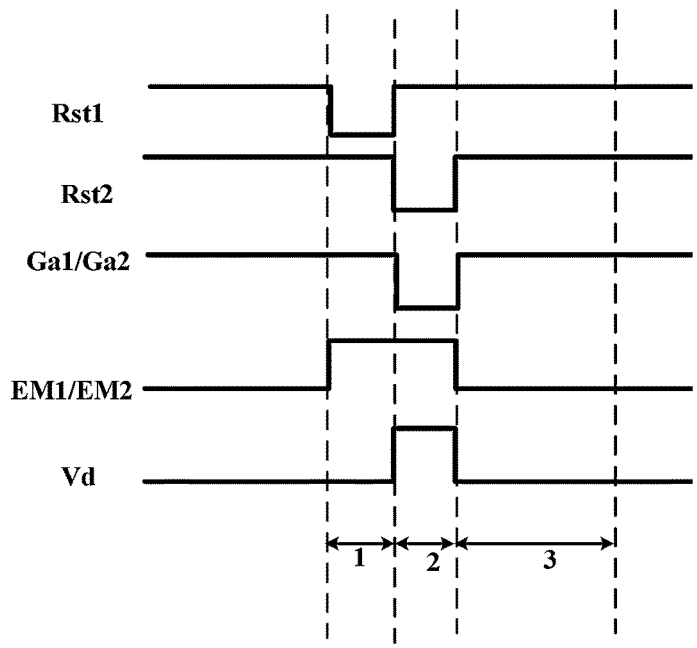
FIG. 3D is a timing signal diagram of a pixel circuit provided by at least one embodiment of the present disclosure.

An operation principle of the pixel circuit shown in FIG. 3B will be described below in conjunction with the signal timing diagram shown in FIG. 3D. As shown in FIG. 3D, a display process of each frame of image includes three stages, namely an initialization stage 1, a data writing and compensation stage 2, and a light emitting stage 3.

As shown in FIG. 3D, in this embodiment, the first scan signal Ga1 and the second scan signal Ga2 are a same signal, the first light emission control signal EM1 and the second light emission control signal EM2 are a same signal; the second reset control signal Rst2 and the first scan signal Ga1/second scan signal Ga2 have a same waveform, that is, the second reset control signal Rst2, the first scan signal Ga1/second scan signal Ga2 may adopt a same signal; the first reset signal Rst1 of sub-pixels in the present row and the first scan signal Ga1/second scan signal Ga2 of sub-pixels in the previous row have a same waveform, that is, adopt a same signal. However, this is not a limitation to the present disclosure; in other embodiments, different signals may be respectively adopted as the first scan signal Ga1, the second scan signal Ga2, the first reset control signal Rst1, and the second reset control signal Rst2; and different signals are respectively adopted as the first light emission control signal EM1 and the second light emission control signal EM2.

In the initialization stage 1, the first reset control signal Rst1 is input to turn on the sixth transistor T6; and the first reset voltage Vinit1 is applied to the gate electrode of the first transistor T1, thereby resetting the first node N1.

In the data writing and compensation stage 2, the first scan signal Ga1, the second scan signal Ga2 and the data signal Vd are input; the second transistor T2 and the third transistor T3 are turned on; the data signal Vd is written into the second node N2 by the second transistor T2, to charge the first node N1 via the first transistor T1 and the third transistor T3 until potential of the first node N1 changes to Vd+Vth when the first transistor T1 is turned off, where, Vth is a threshold voltage of the first transistor T1. The potential of the first node N1 is stored in the storage capacitor Cst and kept, that is to say, voltage information containing the data signal and the threshold voltage Vth is stored in the storage capacitor Cst, for supplying gray scale display data and compensateing for the threshold voltage of the first transistor T1 itself during the subsequent light emitting stage.

In the data writing and compensation stage 2, the second reset control signal Rst2 may also be input to turn on the seventh transistor T7; and the second reset voltage Vinit2 is applied to the fourth node N4, thereby resetting the fourth node N4. For example, the fourth node N4 may also be reset in the initialization stage 1, for example, the first reset control signal Rst1 and the second reset control signal Rst2 may be the same, which will not be limited by the embodiment of the present disclosure.

In the light emitting stage 3, the first light emission control signal EM1 and the second light emission control signal EM2 are input to turn on the fourth transistor T4, the fifth transistor T5 and the first transistor T1; and the fifth transistor T5 applies a driving current to the OLED to cause the same to emit light. A value of the driving current Id flowing through the OLED may be obtained according to a formula below:

$$Id=K(VGS-Vth)^2=K[(Vdata+Vth-VDD)-Vth]^2=K(Vdata-VDD)^2,$$

where, K is an electrical conductivity coefficient of the first transistor.

In the above-described formula, Vth represents the threshold voltage of the first transistor T1, VGS represents a voltage between the gate electrode and the source electrode (which is the first electrode here) of the first transistor T1, and K is a constant value related to the first transistor T1 itself. It may be seen from the above-described calculation formula of Id that, the driving current Id flowing through the OLED is no longer related to the threshold voltage Vth of the first transistor T1, which, thus, can implement compensation on the pixel circuit, solve a threshold voltage drift problem of the drive transistor (which is the first transistor T1 according to the embodiment of the present disclosure) caused by a process technology and long-term operation, eliminate influence thereof on the driving current Id, and improve a display effect of the display apparatus adopting the same.

The structure of the display substrate provided by at least one embodiment of the present disclosure will be exemplified below by taking the pixel circuit shown in FIG. 3B to FIG. 3C as an example, and in conjunction with FIG. 4A to FIG. 4B, FIG. 5, FIG. 6A to FIG. 6B, and FIG. 7A to FIG. C.

Figure 4A:
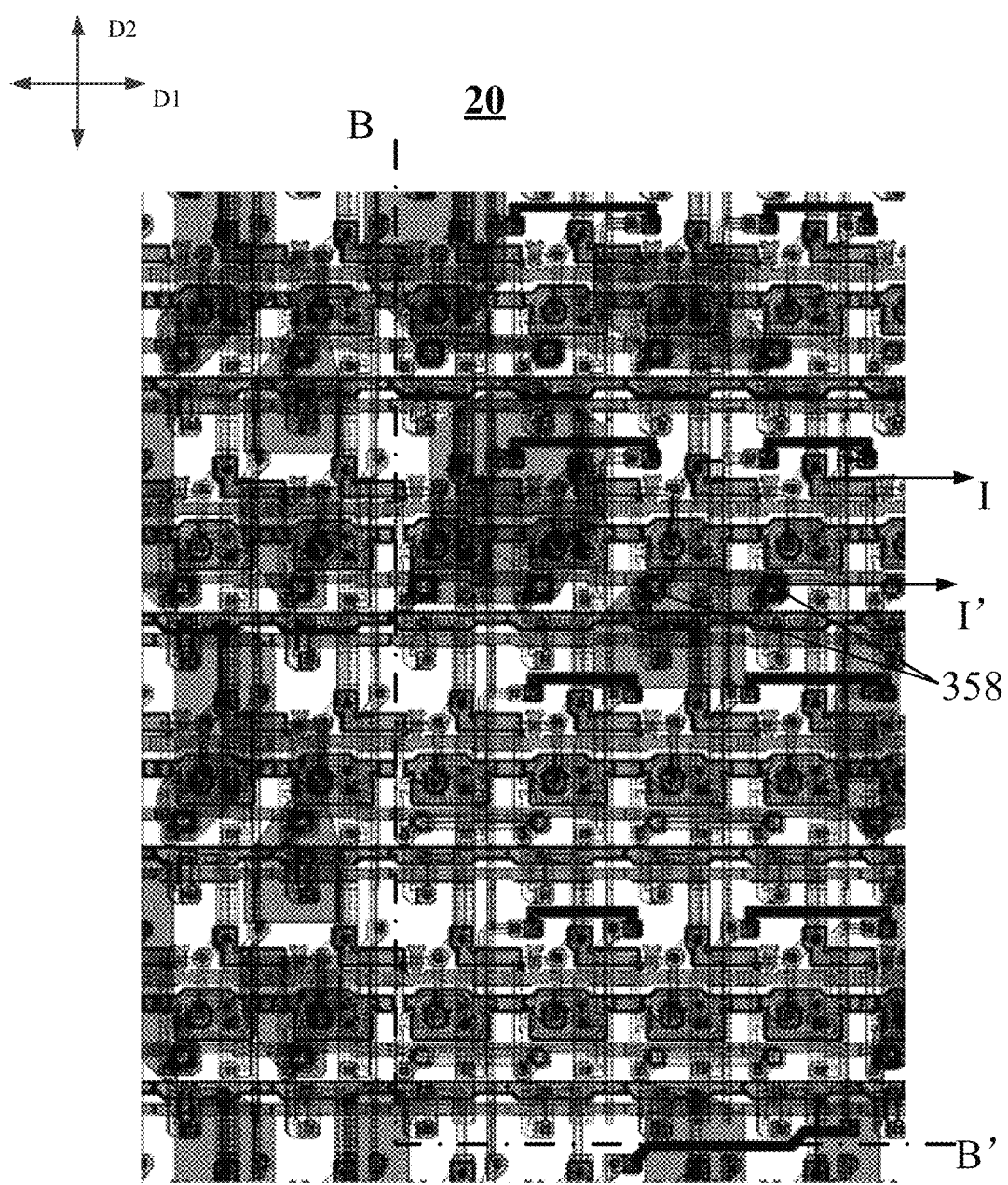
FIG. 4A is a fourth schematic diagram of a display substrate provided by at least one embodiment of the present disclosure.
Figure 4B:
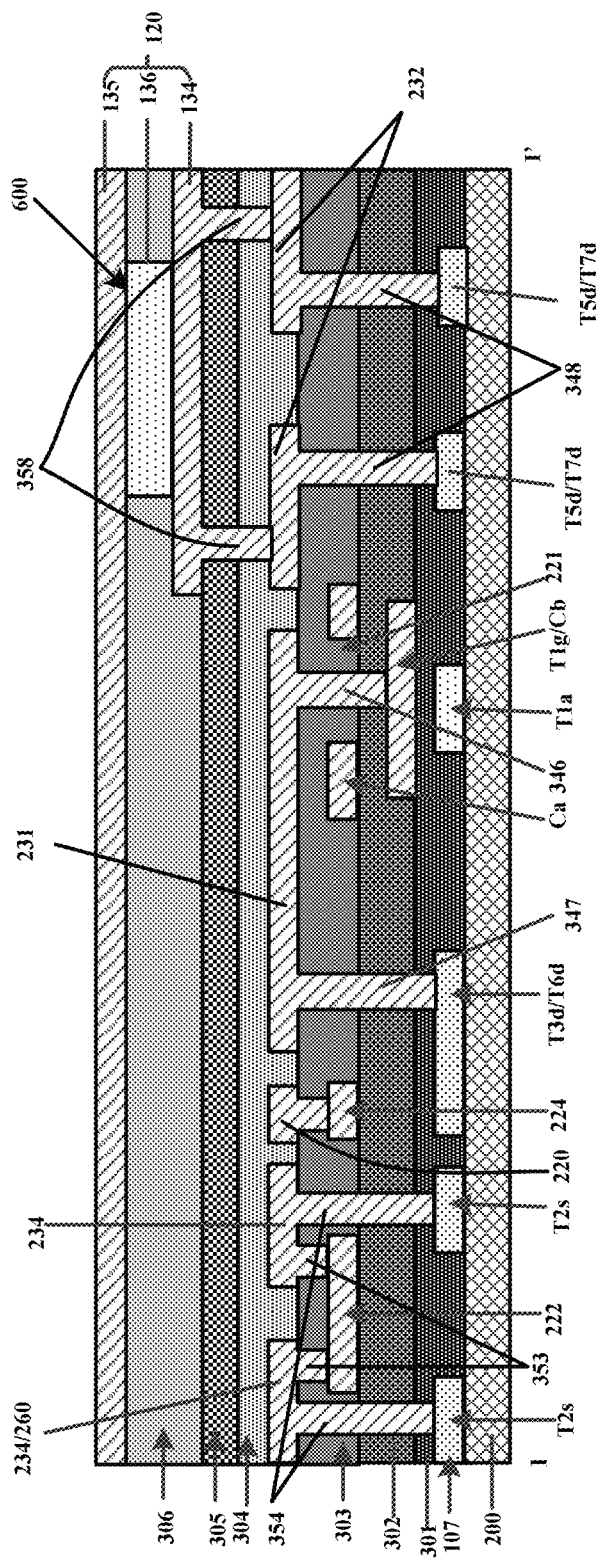
FIG. 4B is a cross-sectional view of FIG. 4A along a section line I-I'.

FIG. 4A is a schematic diagram of a display substrate 20 provided by at least one embodiment of the present disclosure; FIG. 4A correspondingly shows an enlarged schematic diagram of region A at the boundary between the first display region 21 and the second display region 22 in FIG. 2C; a dotted line B-B' in the diagram shows the boundary between the first display region 21 and the second display region 22; FIG. 4A schematically shows four rows and four columns of pixel circuit units in the second display region 22 as well as pixel circuit units in the first display region 21 that are adjacent to them. FIG. 4B is a cross-sectional view of FIG. 4A along a section line I-I'. It should be noted that, for clarity, FIG. 4B omits some structures that do not have a direct electrical connection relationship at the section line. Also for clarity, the section line I-I' is also shown in corresponding positions in FIG. 5, FIG. 6A to FIG. 6B, FIG. 7A to FIG. 7B, and FIG. 8B.

It can be known in conjunction with FIG. 4A to FIG. 4B that, the display substrate 20 includes a semiconductor layer 107, a first insulating layer 301, a first conductive layer 201, a second insulating layer 302, a second conductive layer 202, a third insulating layers 303, a third conductive layer 203, a fourth insulating layer 304 and a fourth conductive layer 204 sequentially arranged on a base substrate 20.

Figure 5:
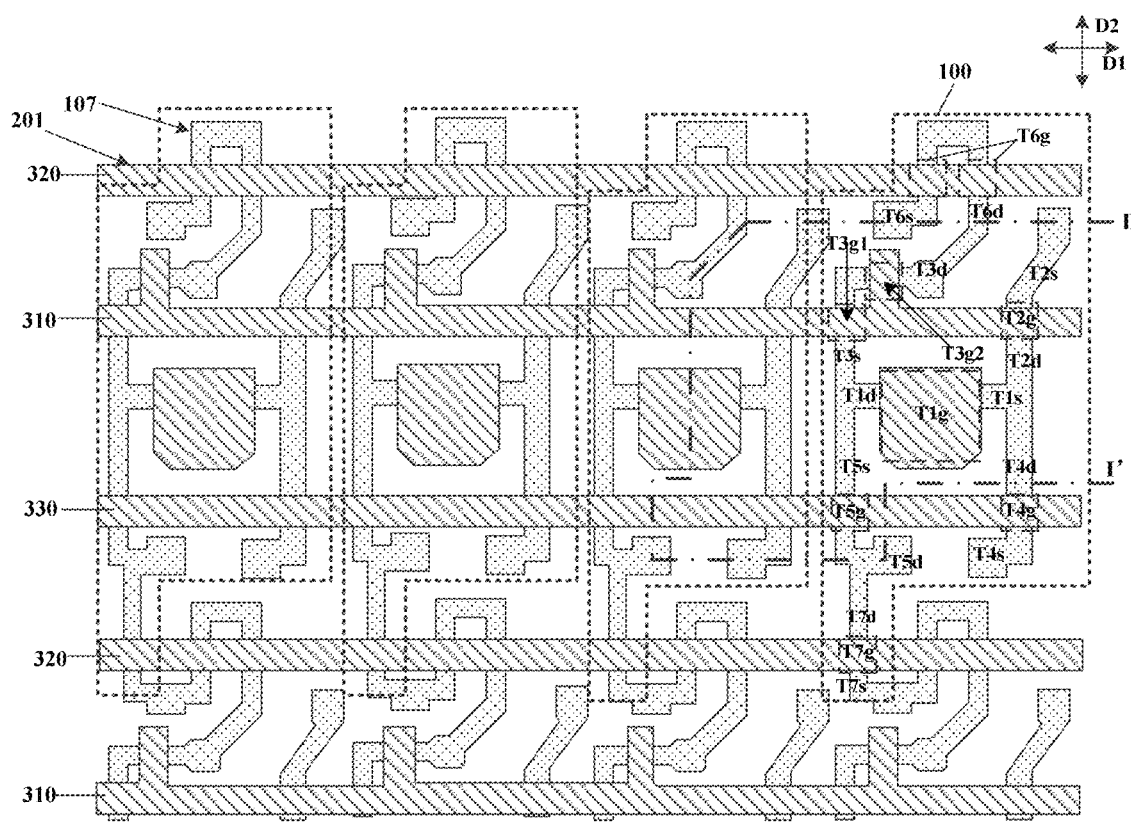
FIG. 5 is a fifth schematic diagram of a display substrate provided by at least one embodiment of the present disclosure.
Figure 6A:
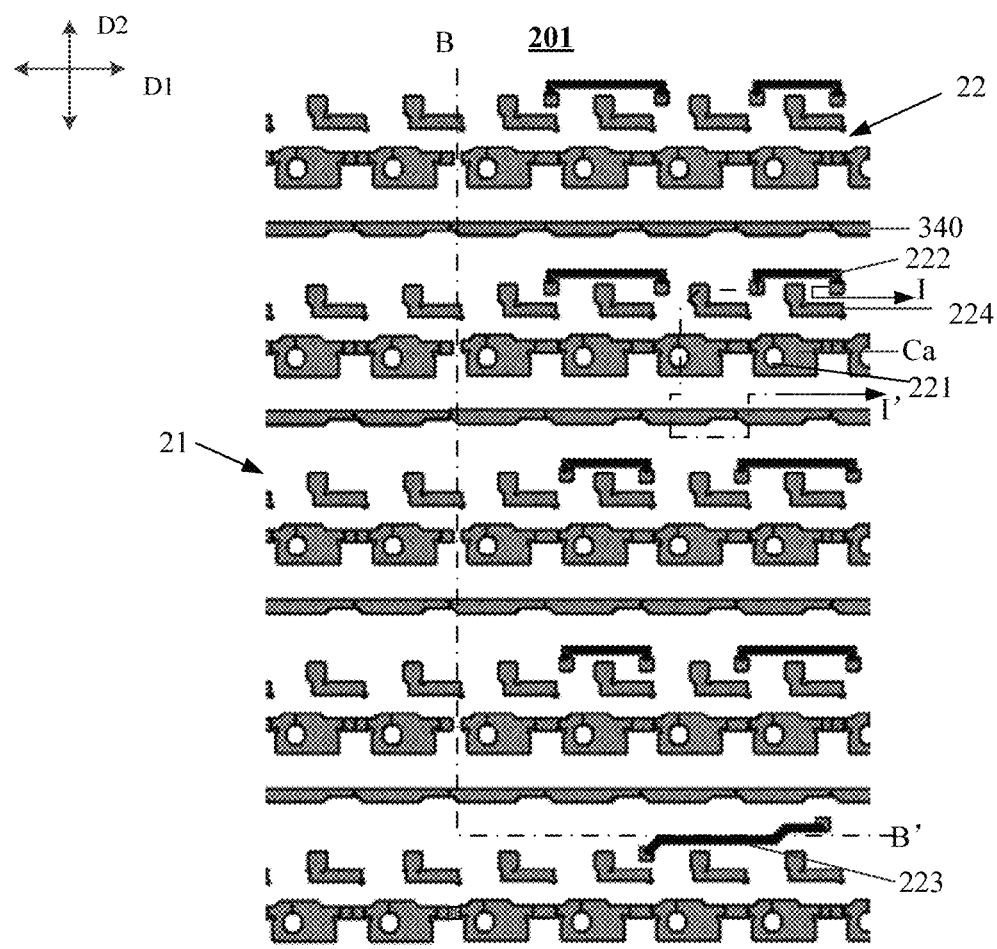
FIG. 6A is a sixth schematic diagram of a display substrate provided by at least one embodiment of the present disclosure.
Figure 6B:
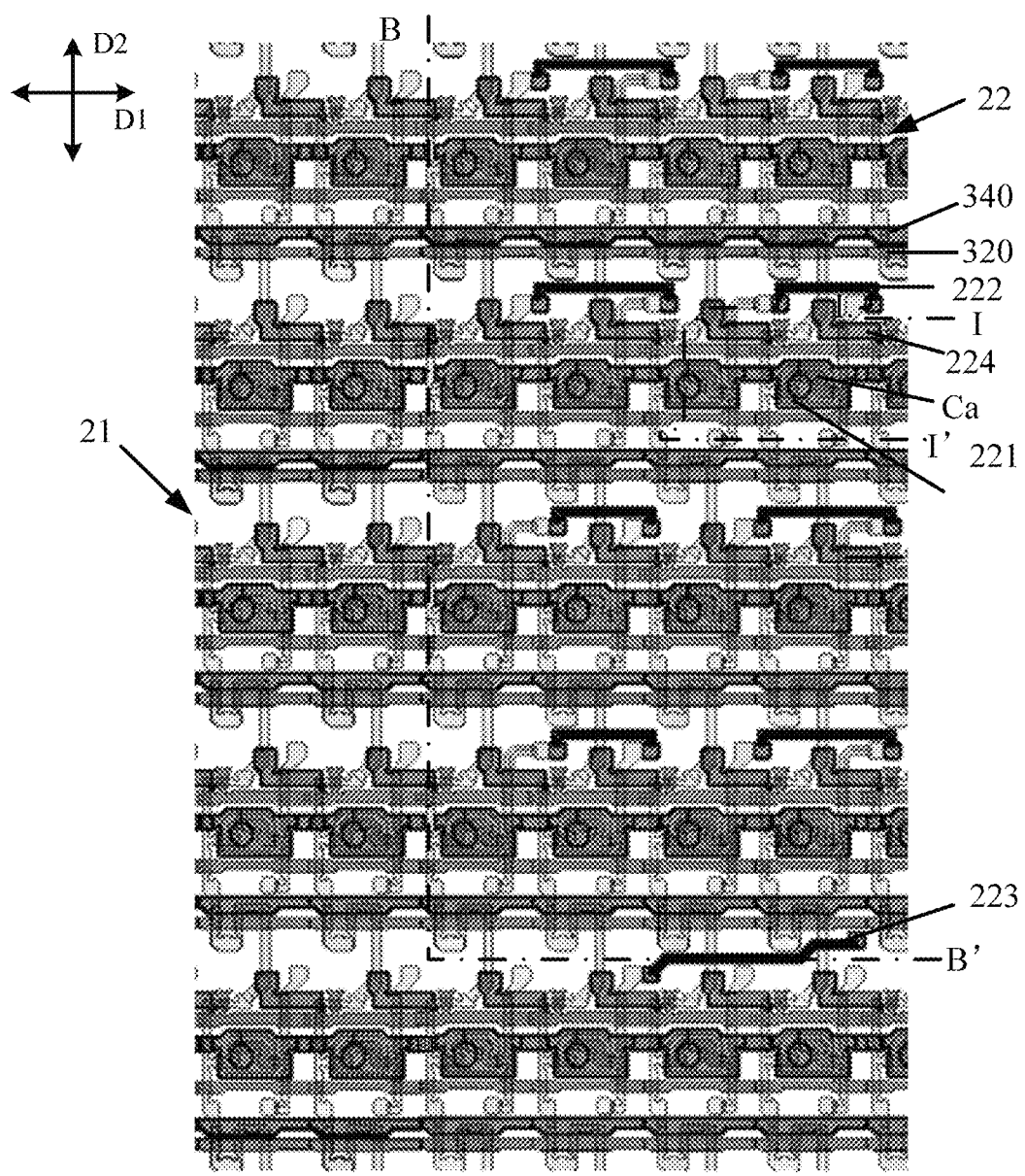
FIG. 6B is a seventh schematic diagram of a display substrate provided by at least one embodiment of the present disclosure.
Figure 7A:
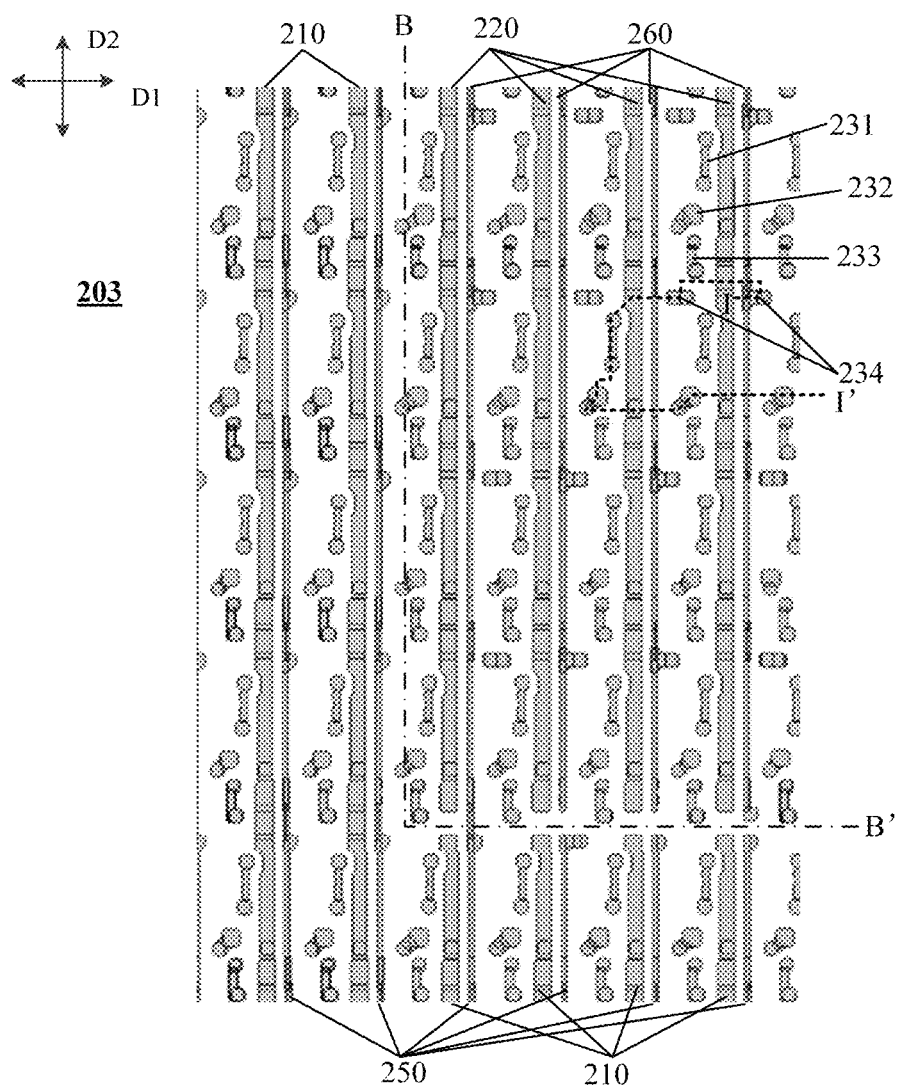
FIG. 7A is an eighth schematic diagram of a display substrate provided by at least one embodiment of the present disclosure.
Figure 7B:
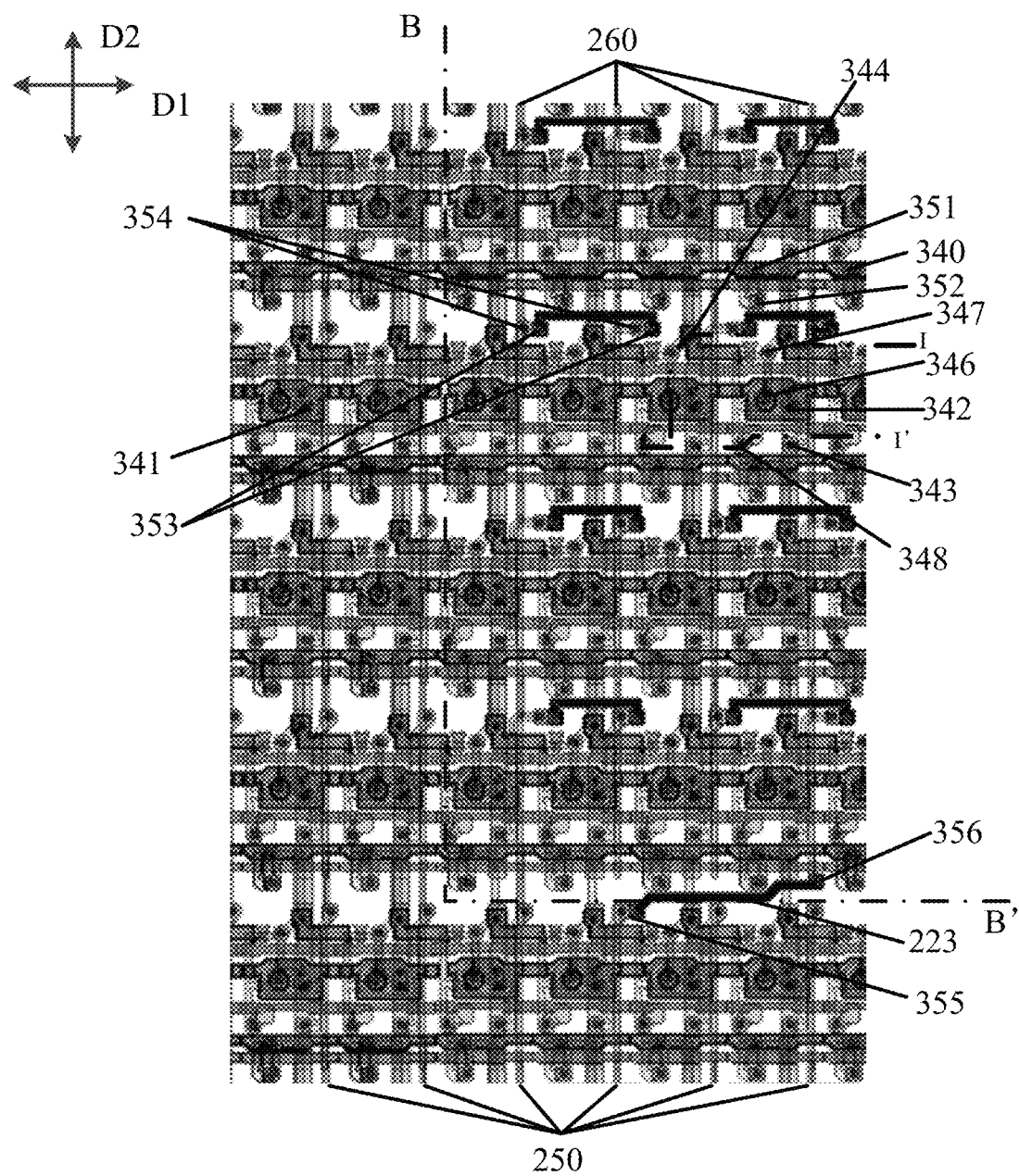
FIG. 7B is a ninth schematic diagram of a display substrate provided by at least one embodiment of the present disclosure.
Figure 7C:
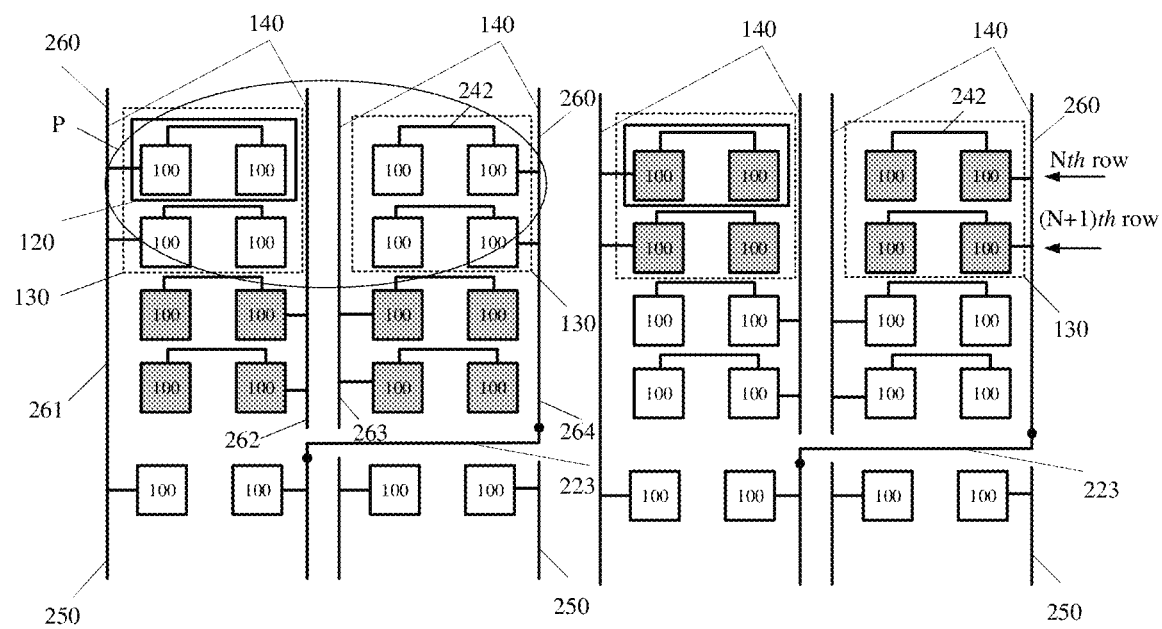
FIG. 7C is a tenth schematic diagram of a display substrate provided by at least one embodiment of the present disclosure.
Figure 8A:
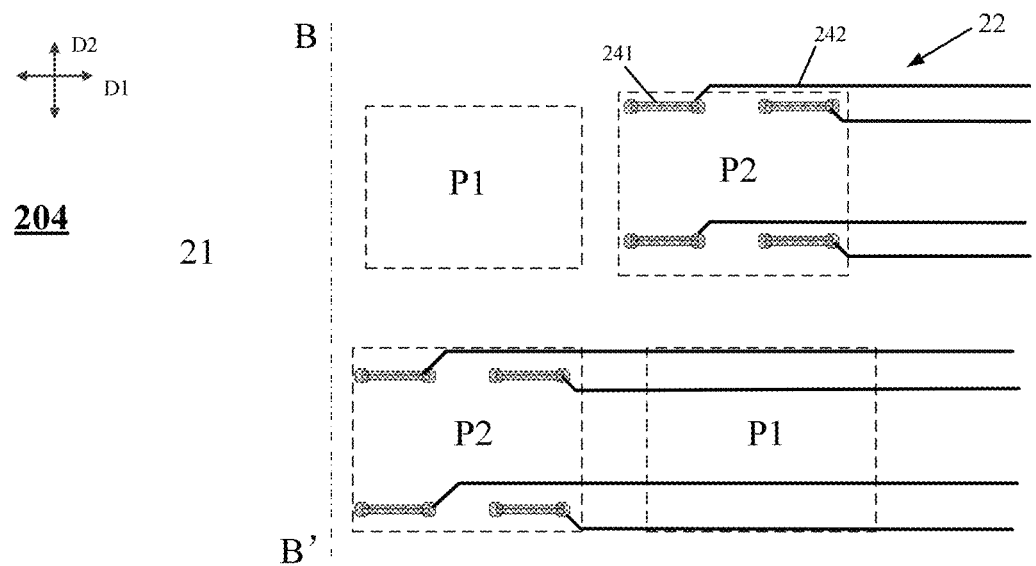
FIG. 8A is a eleventh schematic diagram of a display substrate provided by at least one embodiment of the present disclosure.

A pattern of a semiconductor layer and a pattern of a first conductive layer in each pixel circuit unit are the same; FIG. 5 schematically shows the semiconductor layer 107 and the first conductive layer (gate electrode layer) 201 for transistors T1 to T7 in four pixel circuit units adjacent in the first direction D1; FIG. 6A, corresponding to FIG. 4A, shows the second conductive layer 202; FIG. 6B, corresponding to FIG. 4A, shows the semiconductor layer 107, the first conductive layer 201 and the second conductive layers 202; FIG. 7A shows the third conductive layer 203, FIG. 7B, on the basis of FIG. 6B, shows the third conductive layer 203; FIG. 7C shows a connection schematic diagram of the data lines; FIG. 8A shows the fourth conductive layer 204; and FIG. 8B, on the basis of FIG. 7B, shows the fourth conductive layer 204.

For convenience of description, in the following description, Tng, Tns and Tnd are used to respectively represent a gate electrode, a first electrode, and a second electrode of an nth transistor Tn, where, n is 1 to 7.

It should be noted that, in the present disclosure, the so-called "arranged in a same layer" refers to forming two (or more than two) structures by a same deposition process and a same patterning process; and materials of the two structures may be the same or different. In the present disclosure, the "integral structure" refers to a structure formed of two (or more than two) structures that are connected with each other by patterning a same film layer through a same patterning process, and their materials may be the same or different.

For example, as shown in FIG. 5, the first conductive layer 201 includes the gate electrode of each transistor and some scan lines and control lines. In FIG. 5, a region where each pixel circuit unit is located is shown with a large dashed box, and gate electrodes T1g to T7g of the first to seventh transistors T1 to T7 in one pixel circuit unit 100 are shown with a small dashed box.

The semiconductor layer 107 includes active layers T1a to T7a of the first to seventh transistors T1 to T7. As shown in FIG. 5, the active layers T1a to T7a of the first to seventh transistors T1 to T7 are connected with each other as an integral structure. For example, the semiconductor layers 107 in each column of sub-pixels are connected with each other in an integral structure, and semiconductor layers of two adjacent columns of sub-pixels are spaced apart from each other.

For example, as shown in FIG. 5, the first conductive layer 201 includes gate electrodes T1g to T7g of the first to seventh transistors T1 to T7. For example, a self-alignment process is performed on the display substrate 20 and the semiconductor layer 107 is treated to be conductive by using the first conductive layer 201 as a mask, so that a portion of the semiconductor layer 107 that is not covered by the first conductive layer 201 becomes conductive, and thus portions of an active layer of each transistor that are located on both sides of a channel region become conductive to respectively form the first electrode and the second electrode of the transistor.

For example, the first conductive layer 201 further includes a plurality of gate lines 11 insulated from each other; and the gate lines 11 include, for example, a plurality of scan lines 210, a plurality of reset control lines 220 and a plurality of light emission control lines 230. Here, the gate line 11 refers to a signal line directly connected with the gate electrode of the transistor to supply a scan signal or a control signal. For example, each row of sub-pixels is correspondingly connected with one scan line 210, two reset control lines 220 and one light emission control line 230 respectively.

The scan line 210 and gate electrodes of second transistors T2 in a corresponding row of sub-pixels are electrically connected with each other (or form an integrated structure) to supply the first scan signal Ga1; a reset control line 220 and gate electrodes of sixth transistors T6 in a corresponding row of sub-pixels are electrically connected with each other to supply the first reset control signal Rst1; and the light emission control line 230 and gate electrodes of fourth transistors T4 in a corresponding row of sub-pixels are electrically connected with each other to supply the first light emission control signal EM1.

For example, as shown in FIG. 5, gate electrodes of seventh transistors T7 of the present row of pixel circuits are electrically connected with reset control lines 220 corresponding to a next row of pixel circuits (i.e., the pixel circuit row where the scan line sequentially turned on after the scan line in the present row is located according to a scanning sequence of scan lines) to receive the second reset control signal Rst2.

For example, as shown in FIG. 5, the scan line 210 is also electrically connected with the gate electrode of the third transistor T3 to supply the second scan signal Ga2, that is, the first scan signal Ga1 and the second scan signal Ga2 may be a same signal; the light emission control line 230 is also electrically connected with the gate electrode of the fifth transistor T5 to supply the second light emission control signal EM2, that is, the first light emission control signal EM1 and the second light emission control signal EM2 are a same signal.

For example, the first gate electrode T3$g$1 extends along the first direction D1 and is a portion of the scan line 210. The second gate electrode T3$g$2 extends along the second direction D2 and is an extension portion, which extends along the second direction D2, of the scan line 210.

For example, as shown in FIG. 6A to FIG. 6B, the second conductive layer 202 includes a first capacitor electrode Ca. The first capacitor electrode Ca overlaps with the gate electrode T1$g$ of the first transistor T1 in a direction perpendicular to the base substrate 200 to form the storage capacitor Cst, that is, the gate electrode T1$g$ of the first transistor T1 serves as the second capacitor electrode Cb of the storage capacitor Cst. For example, the first capacitor electrode Ca includes an opening 221; and the opening 221 exposes at least a portion of the gate electrode T1$g$ of the first transistor T1, to allow the gate electrode T1$g$ to be electrically connected with other structures. The first capacitor electrode Ca in the first display region is electrically connected with the first power line 210 through a via hole to receive the first power voltage VDD1; and the first capacitor electrode Ca in the second display region is electrically connected with the second power line 220 through a via hole to receive the second power voltage VDD2, which will be described in detail later.

As shown in FIG. 6A, for example, in the first display region 21, first capacitor electrodes Ca of pixel circuit units 100 in a same pixel row and adjacent to each other are connected with each other as an integral structure; in the second display region 22, first capacitor electrodes Ca of pixel circuit units 100 located in a same row and adjacent to each other are connected with each other as an integral structure.

For example, as shown in FIG. 6A, a first capacitor electrode Ca of a first sub-pixel and a first capacitor electrode Ca of a second sub-pixel that are adjacent to each other in the first direction D1 are arranged in a same layer and spaced apart from each other; the two need to be insulated from each other because the first capacitor electrodes located in the two display regions need to respectively receive different pixel power voltages VDD. FIG. 6A and FIG. 6B respectively show the boundary between the first display region and the second display region with a dotted line B-B', which is the same as the situation in the following respective embodiments, and no details will be repeated.

In some examples, the plurality of third power lines 230 are respectively arranged in one-to-one correspondence with the plurality of rows of first pixel circuits (i.e., the plurality of rows of pixel circuit units in the first display region), the plurality of fourth power lines 240 are respectively arranged in one-to-one correspondence with the plurality of rows of second pixel circuits (i.e., the plurality of rows of pixel circuit units located in the second display region); each third power line is integrally formed with first capacitor electrodes Ca of pixel circuit units of a corresponding row of first sub-pixels, each fourth power line 240 is integrally formed with first capacitor electrodes Ca of pixel circuit units of a corresponding row of second sub-pixels; that is, a portion of the third power line 230 serves as the first capacitor electrode Ca of the first pixel circuit, and a portion of the fourth power line 240 serves as the first capacitor electrode Ca of the second pixel circuit.

For example, as shown in FIG. 6A to FIG. 6B, the second conductive layer 202 may further include a plurality of reset voltage lines 340 extended along the first direction D1; and the plurality of reset voltage lines 340 are connected with the plurality of rows of sub-pixels in one-to-one correspondence. The reset voltage line 340 is electrically connected with first electrodes of sixth transistors T6 of a corresponding row of sub-pixels to supply the first reset voltage Vinit1.

For example, as shown in FIG. 6B, first electrodes of seventh transistors T7 of the present row of sub-pixels are electrically connected with reset voltage lines 340 corresponding to a next row of sub-pixels to receive the second reset voltage Vinit2. This will be described in detail later in conjunction with FIG. 7B.

For example, as shown in FIG. 6A to FIG. 6B, each second sub-pixel located in the second display region 22 further includes a connection electrode 222 (an example of the second connection electrode according to the present disclosure) in the second conductive layer 202; the connection electrode 222 electrically connects first terminals (referring to FIG. 5, i.e., the first electrode T2$s$ of the second transistor T2) of data writing sub-circuits of two pixel circuit units of the second pixel circuit with each other, so that the data writing sub-circuits of the two pixel circuit units write in a same data voltage in the data writing and compensation stage, and thus, the light-emitting element may emit light according to corresponding display gray scale data in the light emitting stage.

For example, as shown in FIG. 6A to FIG. 6B, the second conductive layer 202 further includes a connection electrode 223 (an example of the third connection electrode according to the present disclosure); and the connection electrode 223 is located at the boundary between the first display region 21 and the second display region 22. The connection electrode 223 is configured to electrically connects the first terminal of the data writing sub-circuit of the first sub-pixel in the first display region 21 and the data line in the second display region 22 to supply a data signal to the second sub-pixel, which will be described in detail later in conjunction with FIG. 7B to FIG. 7C.

For example, as shown in FIG. 6A to FIG. 6B, the second conductive layer 202 may further include a shielding electrode 224. For example, the shielding electrode 224 overlaps with the first electrode T2s of the second transistor T2 in the direction perpendicular to the base substrate 200 so as to protect a signal in the first electrode T2s of the second transistor T2 from being interfered by other signals. Since the first electrode T2s of the second transistor T2 is configured to receive the data signal Vd, and the data signal Vd determines a display gray scale of the sub-pixel, the shielding electrode 224 improves stability of the data signal, thereby improving display performance.

For example, referring to FIG. 6B and FIG. 5 in combination, the shielding electrode 224 also at least partially overlaps with the second electrode T6d of the sixth transistor T6 in the direction perpendicular to the base substrate 200, to improve stability of a signal in the second electrode T6d, so as to improve stability of the sixth transistor T6, and further stabilize a gate voltage of the first transistor T1.

For example, referring to FIG. 6B and FIG. 5 in combination, the shielding electrode 224 also extends to an adjacent pixel circuit unit and at least partially overlaps with the active layer of the third transistor T3 in the adjacent pixel circuit unit in the direction perpendicular to the base substrate 200, so as to improve stability of the third transistor T3, and further stabilize the gate voltage of the first transistor T1.

For example, the shielding electrode 224 is configured to be loaded with a fixed voltage; for example, the shielding electrode 224 is electrically connected with a power line in the third conductive layer to load the pixel power voltage VDD, which will be described in detail later in conjunction with FIG. 7B.

For example, as shown in FIG. 7A to FIG. 7B, the third conductive layer 203 includes a plurality of first power lines 210 and a plurality of second power lines 220. For example, the plurality of first power lines 210 are electrically connected with a plurality of columns of pixel circuit units located in the first display region 21 in one-to-one correspondence to supply the first power voltage VDD1. The plurality of second power lines 220 are electrically connected with a plurality of columns of pixel circuit units located in the second display region 22 in one-to-one correspondence to supply the second power voltage VDD2. The first power line 210 and the second power line 220 corresponding to a same column of pixel circuit units are spaced apart from each other for insulation; that is, the first power line 210 correspondingly connected with the first sub-pixel and the second power line 220 correspondingly connected with a pixel circuit unit of the second sub-pixel adjacent to the first sub-pixel in the second direction D2 are spaced apart from each other. For example, the first power line 210 correspondingly connected with the first sub-pixel adjacent to the second sub-pixel in the first direction D1 is continuously arranged in the second direction D2 and runs through the entire first display region 21.

Referring to FIG. 7B in combination, the first power line 210 is electrically connected with first capacitor electrodes Ca in a corresponding column of pixel circuit units 100 through a via hole 341 (an example of the first via hole according to the present disclosure); and the second power line 220 is electrically connected with first capacitor electrodes Ca in a corresponding column of pixel circuit units 100 through a via hole 342 (an example of the second via hole according to the present disclosure). The first power line 210 and the second power line are also respectively electrically connected with the first electrode T4s of a fourth transistor T4 through a via hole 343. The first power line 210 and the second power line 220 are also respectively electrically connected with the shielding electrode 224 through a via hole 344, so that the shielding electrode 224 has fixed potential, and shielding capability of the shielding electrode is improved. For example, the via holes 341, 342 and the via hole 344 all run through the third insulating layer 303; and the via hole 343 runs through the first insulating layer 301, the second insulating layer 302 and the third insulating layer 303.

For example, the third conductive layer 203 further includes a plurality of main data lines 250 and a plurality of auxiliary data lines 260 extended along the second direction, the plurality of main data lines 250 are arranged along the first direction D1, the plurality of auxiliary data lines 260 are arranged along the first direction D1; the plurality of main data lines 250 are electrically connected with first terminals of data sub-circuits of the plurality of columns of pixel circuit units in the first display region 21 in one-to-one correspondence to supply data signals; the plurality of auxiliary data lines 260 are electrically connected with first terminals of data sub-circuits of the plurality of pixel circuit units in the second display region 22 to supply data signals. In the second direction D2, the main data lines 250 and the auxiliary data lines 260 corresponding to a same column of pixel circuit units are in one-to-one correspondence, and each auxiliary data line 260 and a corresponding main data line 250 are arranged in parallel in the second direction D2.

As shown in FIG. 7A to FIG. 7B, an auxiliary data lines 260 and a corresponding main data lines 250 are directly electrically connected or spaced apart and insulated from each other, which is related to a pixel arrangement mode of the display substrate 20.

FIG. 7C shows a schematic diagram of a data line of a display substrate provided by at least one embodiment of the present disclosure; and FIG. 7C schematically shows pixel circuit units 100 in four rows and eight columns (i.e., second pixel circuits 120 in four rows and four columns) located in the second display region and pixel circuit units 100 in one row and eight columns (i.e., first pixel circuits 110 in one row and eight columns) correspondingly located in the first display region.

As shown in FIG. 7C, the plurality of auxiliary data lines 260 are divided into a plurality of data line groups 140; each data line group 140 includes two auxiliary data lines 260; and the plurality of data line groups 140 are respectively electrically connected with the plurality of columns of second pixel circuits 120 in one-to-one correspondence to supply data signals. FIG. 7C shows four data line groups 140 corresponding to four columns of second pixel circuits.

Referring to FIG. 4A to FIG. 4B and FIG. 7B to FIG. 7C in combination, first terminals of data writing sub-circuits of two pixel circuit units in each second pixel circuit 120 are electrically connected with each other through the connection electrode 222; and each second pixel circuit 120 is electrically connected with a corresponding auxiliary data line 260 through the connection electrode 222 to receive the data signal for use by two data writing sub-circuits thereof.

For example, referring to FIG. 7B and FIG. 7C in combination, two second pixel circuits located in the nth row and the (n+1)th row and in a same column among the plurality of rows of second pixel circuits 120 form a pixel circuit group 130 and share one auxiliary data line 260, that is, connection electrodes 222 of the two second pixel circuits in the pixel circuit group 130 are both electrically connected with the auxiliary data line 260; n is an odd number or an even number greater than 0. In the second direction D2, pixel circuit groups 130 located in a same column are alternately electrically connected with two auxiliary data lines 260 in the data line group 140 corresponding to the column of second pixel circuits 120.

Referring to FIG. 7B and FIG. 7C in combination, four auxiliary data lines 260 in two adjacent data line groups 140 are a first data line 261, a second data lines 262, a third data line 263 and a fourth data line 264 sequentially arranged along the first direction. The first data line 261 is directly electrically connected with its corresponding main data line 250; and the second data line 262, the third data line 263 and the fourth data line 264 are respectively arranged in a same layer as and spaced apart from respective corresponding main data line 250. The fourth data line 264 is electrically connected with the main data line 260 corresponding to the second data line 262 through the connection electrode 223. Such an arrangement mode is related to a pixel arrangement mode of the display substrate.

For example, as shown in FIG. 7C, two adjacent pixel circuit groups 130 correspond to four second pixel circuits 120 and constitute a minimal repeating unit P, for example, the four second pixel circuits are respectively configured to drive one red light-emitting element, two green light-emitting elements and one blue light-emitting element to emit light, so that full-color display may be implemented. In this embodiment, one minimal repeating unit P includes four second pixel circuits, which is related to pixel arrangement of the display substrate provided by the embodiment of the present disclosure. However, the number of pixel circuits included in the minimal repeating unit according to the embodiment of the present disclosure will not be limited. For example, in other examples, the minimal repeating unit may include three pixel circuits which are respectively configured to drive one red light-emitting element, one green light-emitting element, and one blue light-emitting element to emit light.

For example, in order to improve display uniformity of the display substrate, it is necessary to provide light-emitting elements in the third display region for display; and in order to improve light transmittance of the third display region, no pixel circuit is provided in the third display region, so pixel circuits corresponding to the light-emitting elements in the third display region need to be arranged in other regions, for example, the second display region. Therefore, in the second display region, there are some second pixel circuits having light-emitting elements corresponding thereto arranged in the second display region; and there are some other second pixel circuits having light-emitting elements corresponding thereto not arranged in the second display region, and these second pixel circuits are provided in units of the minimal repeating unit P, so as not to affect a display function of the display substrate. For example, the second display region includes N minimal repeating units P; among the N minimal repeating units P, there are M minimal repeating units P (referred to as first minimal repeating units P1) whose second pixel circuits 120 have light-emitting elements corresponding thereto arranged in the second display region 22, and there are remaining N−M minimal repeating units P (referred to as second minimal repeating units P2) whose second pixel circuits 120 have light-emitting elements corresponding thereto not arranged in the second display region 22. For example, among the N minimal repeating units P, there are L minimal repeating units P, whose second pixel circuits has light-emitting elements corresponding thereto arranged in the third display region 23, for example, L is less than or equal to N−M; M is less than N; N, M and L are all positive integers.

For example, FIG. 7C shows four minimal repeating units P arranged in an array; and the four minimal repeating units P are arranged in two rows and two columns. The four minimal repeating units P are divided into two pairs; the two pairs of minimal repeating units are distinguished by different filling modes in FIG. 7C; each pair of minimal repeating units P includes two minimal repeating units P in different rows and in different columns; among the two pairs of minimal repeating units P, only one pair of minimal repeating units P is configured to emit light in the second display region, that is, light-emitting elements corresponding to only one pair of minimal repeating units P are located in the second display region, and the other pair of minimal repeating units P has no light-emitting elements correspondingly provided in the second display region. In other words, among the two minimal repeating units P adjacent in the row direction or the column direction, only one has light-emitting elements corresponding thereto located in the second display region, and the other minimal repeating unit has no light-emitting elements correspondingly provided in the second display region, that is, the two minimal repeating units P include a first minimal repeating unit P1 and a second minimal repeating unit P2. Such a staggered arrangement mode avoids a large display blank region in the second display region, which thus can improve uniformity of the second display region.

For example, the second minimal repeating unit P2 either has light-emitting elements corresponding thereto provided in the third display region 23 or is provided with no light-emitting elements. In the case that the minimal repeating unit P is arranged as above in the second display region, and the number of light-emitting elements corresponding to the second minimal repeating unit exceeds the number of light-emitting elements that need to be provided in the third display region, there will be some second minimal repeating units P2 which has no light-emitting elements provided correspondingly so as to form dummy pixels, in which case, L is smaller than N−M. Such arrangement can improve display uniformity of the second display region 22.

For example, referring to FIG. 7C continuously, auxiliary data lines 260 connected with the second pixel circuits in the first minimal repeating unit P1 all receive data signals from the main data line 250 in the first display region below (i.e., a display region adjacent to the second display region in the second direction D2); and the auxiliary data line 260 connected with the second pixel circuit in the second minimal repeating unit P2 receive the data signal from a data signal trace (not shown) arranged above the second display region (on a side away from the first display region in the second direction D2). Such arrangement helps simplify wiring.

For example, as shown in FIG. 2C, the second display region 22 is located at an edge of the display region; the display substrate further includes a data signal trace (not shown) located in the non-display region; and the data line signal trace is arranged around the display region, and accesses to the second display region from an upper side of the display region (a side opposite to the first power voltage terminal and the second power voltage terminal). For example, the display substrate further includes a data signal terminal (not shown) located in the non-display region; the data signal terminal is, for example, located on a lower side of the display region; and the data signal trace has one terminal electrically connected with the data signal terminal to receive a data signal, and the other terminal access to the second display region to supply the data signal. For example, the arrangement mode of the data signal trace is similar to the arrangement mode of the second power wire 106.

For example, as shown in FIG. 7C, the first data line 261 and the fourth data line 264 are respectively connected with second pixel circuits 120 belonging to the first minimal repeating unit P1 in two adjacent columns of second pixel circuits 120 in the second display region to supply data signals, so the first data line 261 and the fourth data line 264 are respectively connected with the corresponding two adjacent main data lines 250 in the first display region to receive the corresponding data signals.

For example, as shown in FIG. 7C, the second data line 262 and the third data line 263 are respectively connected with second pixel circuits 120 belonging to the second minimal repeating unit P2 in two adjacent columns of second pixel circuits 120 in the second display region to supply the data signal, so the second data line 262 and the third data line 263 are connected with the data signal trace (not shown) provided on a side of the second display region that is away from the first display region in the second direction D2 to receive the data signal.

As shown in FIG. 4A to FIG. 4B and FIG. 7A to FIG. 7B, the third conductive layer 203 further includes a connection electrode 231; the connection electrode 231 has one terminal electrically connected with the gate electrode T1g of the first transistor T1, i.e., the second capacitor electrode Cb, through the opening 221 in the first capacitor electrode Ca and the via hole 346 in the insulating layer, and the other terminal electrically connected with the second electrode T3d of the third transistor T3 through the via hole 347, so that the second capacitor electrode Cb is electrically connected with the second electrode T3d of the third transistor T3. For example, the via hole 346 runs through the second insulating layer 302 and the third insulating layer 303. For example, the via hole 347 runs through the first insulating layer 301, the second insulating layer 302 and the third insulating layer 303.

For example, as shown in FIG. 4A to FIG. 4B and FIG. 7A to FIG. 7B, the third conductive layer 203 further includes a connection electrode 232 (an example of the first connection electrode according to the present disclosure) located in each pixel circuit unit 100; the second connection electrode 232 is electrically connected with the second electrode T5d of the fifth transistor T5 through a via hole 348, and is configured to electrically connect the second electrode T5d of the fifth transistor T5 and the first electrode 134 of the light-emitting element. For example, the via hole 348 runs through the first insulating layer 301, the second insulating layer 302 and the third insulating layer 303.

For example, the first sub-pixel includes a light-emitting element 121 (an example of the first light-emitting element according to the present disclosure); and the light-emitting element 121 is electrically connected with the connection electrode 134 of the pixel circuit unit of the first sub-pixel in one-to-one correspondence.

For example, the second sub-pixel includes a light-emitting element 121 (an example of the second light-emitting element according to the present disclosure); and the light-emitting element 121 is electrically connected with both the connection electrodes 134 of the two pixel circuit units of the second sub-pixel.

For example, as shown in FIG. 7A to FIG. 7B, the third conductive layer 203 further includes a connection electrode 233; the third connection electrode 233 has one terminal electrically connected with the reset voltage line 340 through the via hole 351, and the other terminal electrically connected with the first electrode T6s of the six transistor T6 through the via hole 352, so that the first electrode T6s of the sixth transistor T6 may receive the first reset voltage Vinit1 from the reset voltage line 340. For example, the via hole 351 runs through the third insulating layer 303. For example, the via hole 352 runs through the first insulating layer 301, the second insulating layer 302 and the third insulating layer 303.

For example, as shown in FIG. 7B, first electrodes of seventh transistors T7 of a previous row of sub-pixels are electrically connected with the reset voltage line 340 corresponding to the present row of sub-pixels to receive the second reset voltage Vinit2; and first electrodes of seventh transistors T7 of the present row of sub-pixels are electrically connected with the reset voltage line 340 corresponding to a next row of sub-pixels to receive the second reset voltage Vinit2.

For example, as shown in FIG. 4A to FIG. 4B and FIG. 7A to FIG. 7B, the third conductive layer 203 further includes a connection electrode 234 located in each pixel circuit unit; the connection electrode 234 is configured to electrically connect the first electrode T2s of the second transistor T2 and the connection electrode 222, that is, the connection electrode 222 is not directly electrically connected with the first electrode T2s of the second transistor T2 through the via hole running through the second insulating layer 302, thereby saving a patterning process for the second insulating layer 302.

As shown in FIG. 4A to FIG. 4B, with respect to a second pixel circuit, two connection electrodes 234 in two pixel units are respectively arranged close to two auxiliary data lines 260 corresponding to the two pixel circuit units; one of the two auxiliary data lines 260 is electrically connected with the second pixel circuit and directly connected with a connection electrode 234 close thereto as an integral structure; the other is spaced apart from a connection electrode 234 close thereto so as to be insulated from the second pixel circuit.

As shown in FIG. 4A to FIG. 4B and FIG. 7A to FIG. 7B, the connection electrode 234 is electrically connected with the connection electrode 222 through the via hole 353, and is electrically connected with the first electrode T2s of the second transistor T2 through the via hole 354. For example, the via hole 353 runs through the third insulating layer 303, and the via hole 354 runs through the first insulating layer 301, the second insulating layer 302 and the third insulating layer 303.

For example, as shown in FIG. 7B, the connection electrodes 223 are electrically connected with the connection electrode 234 located in the first display region 21 and the fourth data line 264 located in the second display region 22 respectively through the via hole 355 and the via hole 356.

FIG. 8A, corresponding to the circuit structure of FIG. 7C, shows the fourth conductive layer 204, wherein a dotted line B-B' is used to show the boundary between the first display region 21 and the second display region 22, and a dashed box is used to show a region where the first minimal repeating unit P1 is located and a region where the second minimal repeating unit P2 is located.

As shown in FIG. 8A, the fourth conductive layer 204 has no pattern in the first display region 21. In other examples, the fourth conductive layer 204 may include an transfer electrode located in the first display region; and the transfer electrode, for example, is configured to electrically connect the light-emitting element and an underlying pixel circuit, which will not be limited by the embodiment of the present disclosure.

Figure 8B:
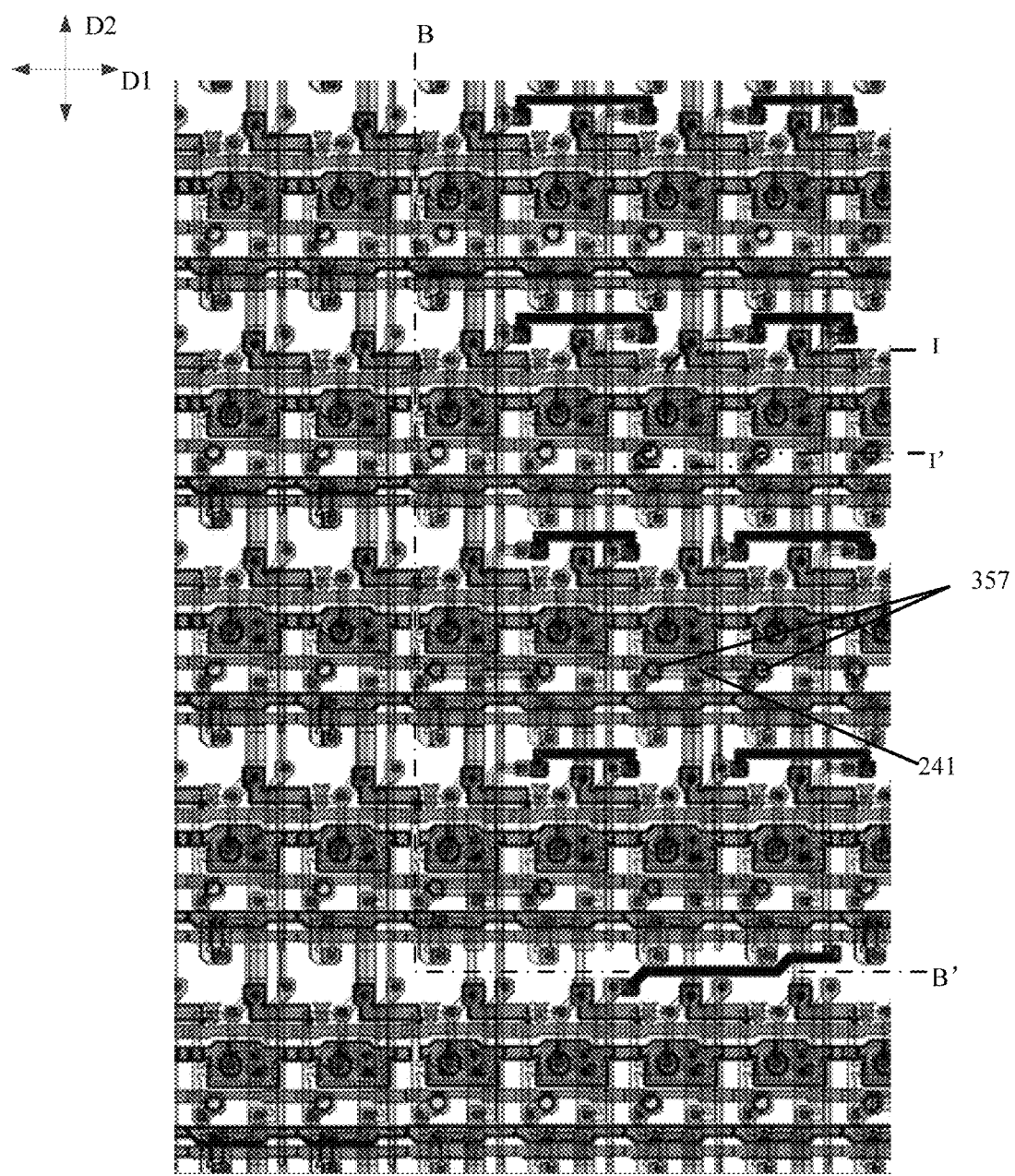
FIG. 8B is a twelfth schematic diagram of a display substrate provided by at least one embodiment of the present disclosure.

As shown in FIG. 8A, the fourth conductive layer 204 includes a connection electrode 241 (an example of the fourth connection electrode according to the present disclosure) located in the second display region 22; the connection electrode 241 is provided correspondingly to each second pixel circuit 120 in the second minimal repeating unit P2; the connection electrode 241 is configured to electrically connect connection electrodes 232 of two pixel circuit units 100 in the second pixel circuit 120. Referring to FIG. 8B in combination, the connection electrode 241 is electrically connected with the connection electrodes 232 of the two pixel circuit units 100 respectively through the via hole 357; and the via hole 357, for example, runs through the fourth insulating layer 304.

For example, as shown in FIG. 8A, the fourth conductive layer 204 includes a plurality of connection lines 242; and the connection lines 242 are arranged in one-to-one correspondence and electrically connected with the connection electrodes 241, for example, as an integral structure. The connection line 242 extends from the second display region 22 to the third display region 23, and is configured to electrically connect the connection electrode 241 and the light-emitting element located in the third display region 23. For example, the plurality of connection lines 242 extend along the first direction D1.

In other examples, the connection electrode 241 is neither electrically connected with the light-emitting element, nor is correspondingly provided with the connection line 242, that is, the second pixel circuit in the second minimal repeating unit corresponding to the connection electrode forms a dummy pixel.

For example, as shown in FIG. 8A in conjunction with FIG. 4A to FIG. 4B, the fourth conductive layer 204 provided with no connection electrode 241 in a region corresponding to the first minimal repeating unit P1, because the connection electrode 232 of the pixel circuit unit in the first minimal repeating unit P1 is directly electrically connected with the first electrode of the light-emitting element corresponding thereto (referring to FIG. 4B), and the connection electrode 241 and the connection line 242 need not be provided in the fourth conductive layer 204. In other examples, the fourth conductive layer 204 may be provided with a transfer electrode in a region corresponding to the first minimal repeating unit P1, for example, the transfer electrode is configured to electrically connect the light-emitting element and the underlying pixel circuit, which will not be limited by the embodiment of the present disclosure.

For example, as shown in FIG. 8A, the connection line 242 correspondingly connected with the second minimal repeating unit P2 may reach the third display region 23 through the region corresponding to the first minimal repeating unit P1, that is, the connection line 242 may overlap with the pixel circuit unit in the first minimal repeating unit P1 in the direction perpendicular to the base substrate.

For example, the fourth conductive layer 204 is made of a transparent conductive metal oxide material, for example, Indium Tin Oxide (ITO), Indium Zinc Oxide (IZO), Zinc Oxide (ZnO), Zinc Aluminum Oxide (AZO), etc. Since the connection line 242 extends to the third display region 23, setting the fourth conductive layer 204 as a transparent conductive material can improve light transmittance of the third display region.

Figure 9A:
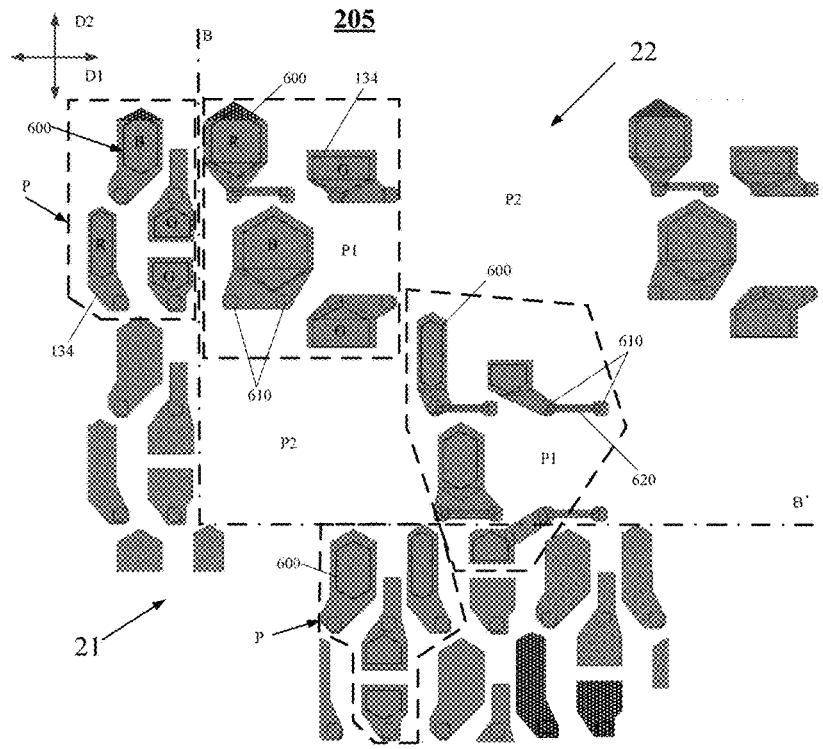
FIG. 9A is a thirteenth schematic diagram of a display substrate provided by at least one embodiment of the present disclosure.
Figure 9B:
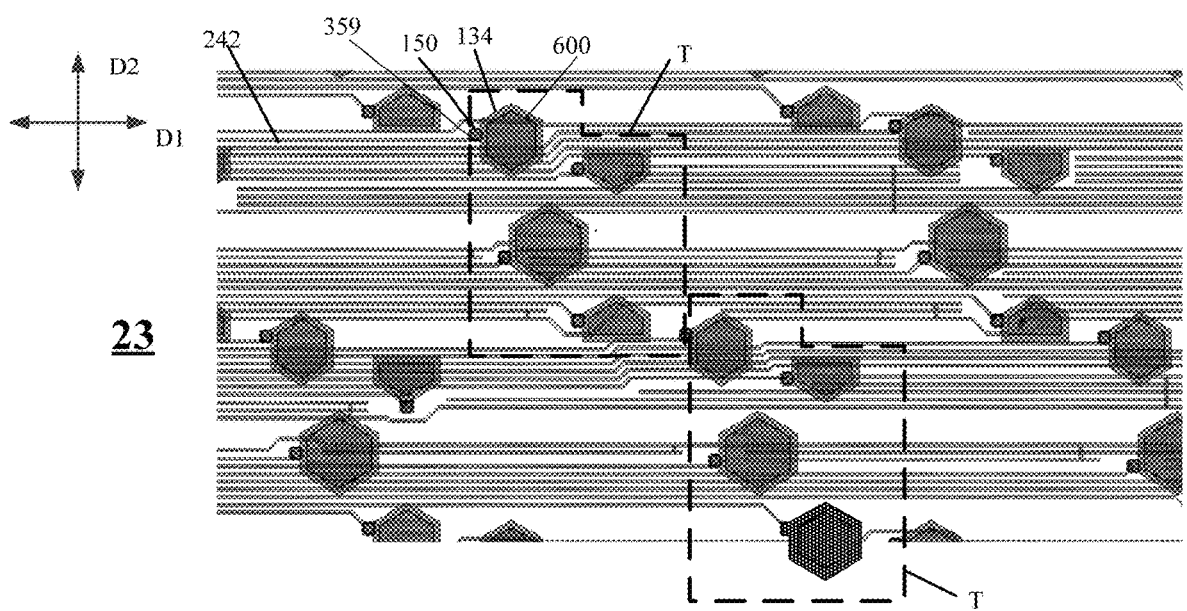
FIG. 9B is a fourteenth schematic diagram of a display substrate provided by at least one embodiment of the present disclosure.

For example, the display substrate 20 may further include a fifth insulating layer and a fifth conductive layer sequentially located on the fourth conductive layer. FIG. 9A and FIG. 9B show schematic diagrams of the fifth conductive layer 205, wherein FIG. 9A shows a pattern of the fifth conductive layer 205 corresponding to region A in FIG. 2C; and FIG. 9B shows a pattern of the fifth conductive layer 205 in the third display region 23. The fifth conductive layer 205 includes first electrodes 134 of the respective light-emitting elements 121.

In FIG. 9A, a dotted line B-B' is used to show the boundary region between the first display region 21 and the second display region 22; and a dashed box is used to respectively show a first electrode of a light-emitting element corresponding to the first minimal repeating unit P1 located in the second display region 22 and a first electrode of a light-emitting element corresponding to the minimal repeating unit P located in the first display region 21. For example, each minimal repeating unit corresponds to four light-emitting elements 121.

As shown in FIG. 9A, in the second display region 22, a region of the fifth conductive layer 205 that corresponds to the second minimal repeating unit P2 is not provided with the first electrode 134, because the second minimal repeating unit P2 has a corresponding light-emitting element provided in the third display region, or is not provided with any light-emitting element correspondingly (corresponding to a situation of dummy pixels).

Referring to FIG. 4A to FIG. 4B in combination, the first electrode 134 is electrically connected with connection electrodes 232 of two pixel circuit units 100 in a corresponding second pixel circuit 120 through the via hole 358, so that the two pixel circuit units 100 are connected to a same light-emitting element 121. FIG. 9A shows two contact hole regions 610 of the first electrode 134 corresponding to the two via holes 358, that is, the region where first electrode 134 contacts with the connection electrode 232 to form electrical connection. As shown in FIG. 9A, in the case a main body portion of the first electrode 134 does not cover the two via holes 358, the first electrode 134 includes an extension portion 620 to cover the via holes 358. The via holes 358, for example, run through the fourth insulating layer 304 and the fifth insulating layer 305.

For convenience of description, FIG. 9B also shows the connection line 242 in the fourth conductive layer 204. Referring to FIG. 8A together, a plurality of connection lines 242 extend from the second display region 22 to the third display region 23, and are electrically connected in one-to-one correspondence with the plurality of first electrodes 134 in the third display region 23; and each first electrode 134 is connected to a corresponding connection electrode 241 through a corresponding connection line 242, so as to be electrically connected with a corresponding second pixel circuit 120. As shown in FIG. 9B, each first electrode 134 includes a connection portion 150; and the connection portion is configured to be electrically connected with a corresponding connection line 242 through a via hole 359. The via hole 359, for example, runs through the fifth insulating layer 305.

As shown in FIG. 9B, for example, every four first electrodes 134 constitute a pixel electrode group T; and the four first electrodes 134 are respectively electrically connected in one-to-one correspondence with four second pixel circuits 120 in a second minimal repeating unit P2. With respect to each row, the pixel electrode group T exists only in an odd-numbered column or an even-numbered column; with respect to each column, the pixel electrode group T exists only in an odd-numbered row or an even-numbered row; that is, with respect to each pixel electrode group T, there is no pixel electrode group directly adjacent thereto in both the first direction D1 (the row direction) and the second direction D2 (column direction). Such an arrangement rule is similar to the arrangement rule of the fifth conductive layer 205 in the third display region 23, which is to improve uniformity of display.

For example, referring to FIG. 4A to FIG. 4B, the display substrate 20 may further include a pixel defining layer 306 located on a side of the first electrode of the light-emitting element that is away from the base substrate 200. An opening is formed in the pixel defining layer 306 to expose at least a portion of the first electrode 134 so as to define opening regions (i.e., light-emitting regions) 600 of the respective sub-pixels of the display substrate. A light-emitting layer 136 of the light-emitting element 121 is formed at least in the opening (the light-emitting layer 136 may also cover a portion of a surface on a side of the pixel defining layer that is away from the first electrode of the light-emitting element); and the second electrode 135 is formed on the light-emitting layer 136 to form the light-emitting element 121. For example, the second electrode 135 is a common electrode, and has an entire surface arranged in the display substrate 20. For example, the first electrode 134 is an anode of the light-emitting element, and the second electrode 135 is a cathode of the light-emitting element.

FIG. 9A and FIG. 9B respectively show a position of the opening region 600 on the first electrode of the light-emitting element 121, and show positions of the contact hole regions 610 or the via hole 359 relative to the respective first electrodes 134. As shown in FIG. 9A and FIG. 9B, an orthogonal projection of the contact hole region 610 or the via hole 358 on the base substrate 200 does not overlap with an orthogonal projection of the opening region 600 on the base substrate 200, that is, the orthogonal projection the contact hole region 610 or the via hole 358 on the base substrate 200 is located outside the orthogonal projection of the opening region 600. Such arrangement prevents the via hole from affecting flatness of the light-emitting layer in the opening region and thus affecting light emission quality.

For example, the second display region 22 includes X second pixel circuits 120 and Y light-emitting elements 121 (an example of the second light-emitting element according to the present disclosure); and the Y light-emitting elements are electrically connected in one-to-one correspondence with Y second pixel circuits in the X second pixel circuits, where, X and Y are both positive integers, and Y is less than X.

For example, the third display region 23 includes Z light-emitting elements 121 (an example of the third light-emitting element according to the present disclosure); and first electrodes of the Z light-emitting elements are electrically connected in one-to-one correspondence with connection electrodes 241 of Z second pixel circuits 120 in the X second sub-pixel circuits respectively through the connection lines 242, where, Z is a positive integer less than or equal to X-Y.

As shown in FIG. 9A, with respect to four light-emitting elements driven by each minimal repeating unit P, an area of an opening region 600 of a green light-emitting element (G) is the smallest, and an area of an opening region of a blue light-emitting element (B) is the largest. This is because human eyes are more sensitive to green, and a blue light-emitting material has a shortest service life, so a larger light-emitting area is required to improve light emission stability of the display substrate.

For example, as shown in FIG. 9A, an area of an opening region 600 of at least one light-emitting element in the second display region 22 is larger than an area of an opening region of a light-emitting element emitting light of a same color in the first display region 21. This is because pixel density in the second display region is low, density of light-emitting elements (the number of light-emitting elements per unit area) is low, and uniformity of the entire display substrate can be further improved by increasing a light-emitting region of a single light-emitting element, that is, the opening region.

For example, the base substrate 200 may be a rigid substrate, for example, a glass substrate, a silicon substrate, etc., or may also be made of a flexible material with excellent heat resistance and durability, for example, polyimide (PI), polycarbonate (PC), Polyethylene glycol terephthalate (PET), polyethylene, polyacrylate, polyarylate, polyetherimide, polyethersulfone, polyethylene terephthalate (PET), polyethylene (PE), polypropylene (PP), polysulfone (PSF), polymethyl methacrylate (PMMA), triacetate cellulose (TAC), cyclic olefin polymers (COP) and cyclic olefin copolymers (COC), etc.

For example, materials of the semiconductor layer 107 include but are not limited to silicon-based materials (amorphous silicon a-Si, polycrystalline silicon p-Si, etc.), metal oxide semiconductors (IGZO, ZnO, AZO, IZTO, etc.), and organic materials (hexathiophene, polythiophene, etc.).

For example, materials of the first to fourth conductive layers may include gold (Au), silver (Ag), copper (Cu), aluminum (Al), molybdenum (Mo), magnesium (Mg), tungsten (W) and alloy materials composed of the above metals; or transparent conductive metal oxide materials, for example, Indium Tin Oxide (ITO), Indium Zinc Oxide (IZO), Zinc Oxide (ZnO), Zinc Aluminum Oxide (AZO), etc.

For example, the light-emitting element 121 has a top emission structure; and the first electrode 134 is reflective and the second electrode 135 is transmissive or semi-transmissive. For example, the first electrode 134 is made of a high work function material to act as an anode, for example, has an ITO/Ag/ITO stack structure; the second electrode 135 is made of a low work function material to act as a cathode, for example, is made of a semi-transmissive metal or a metal alloy material, for example, an Ag/Mg alloy material.

For example, the first insulating layer 301, the second insulating layer 302, the third insulating layer 303, the fourth insulating layer 304 and the fifth insulating layer 305 are, for example, inorganic insulating layers, which are made of, for example, oxide of silicon, nitride of silicon, or oxynitride of silicon, such as silicon oxide, silicon nitride, silicon oxynitride, etc. or insulating materials including metal oxynitride such as aluminum oxide, titanium nitride, etc. For example, the fourth insulating layer 304 and the fifth insulating layer 305 may also be made of organic insulating materials like the pixel defining layer 306, for example, organic insulating materials such as polyimide (PI), acrylate, epoxy resin, polymethyl methacrylate (PMMA), etc. For example, the fourth insulating layer 304 and the fifth insulating layer are planarization layers, which will not be limited by the embodiment of the present disclosure.

Figure 10A:
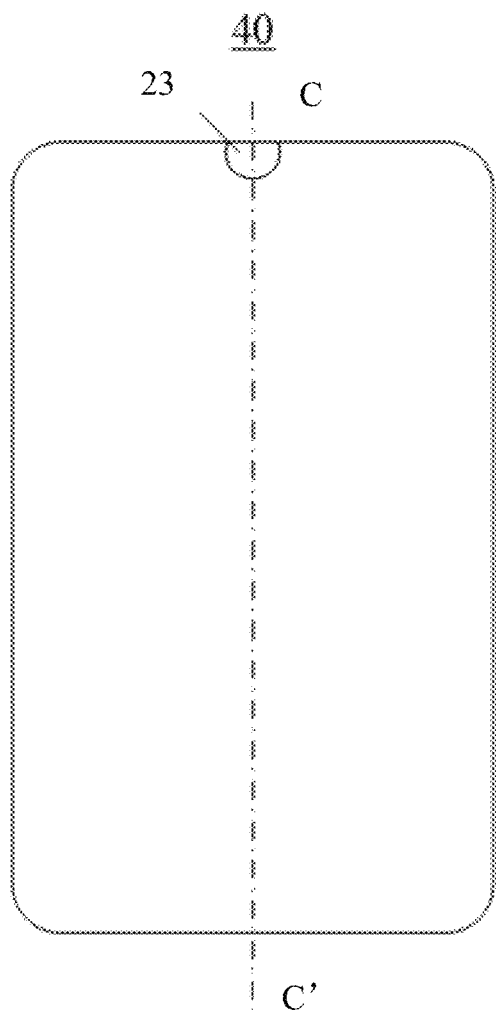
FIG. 10A is a schematic diagram of a display apparatus provided by at least one embodiment of the present disclosure.
Figure 10B:
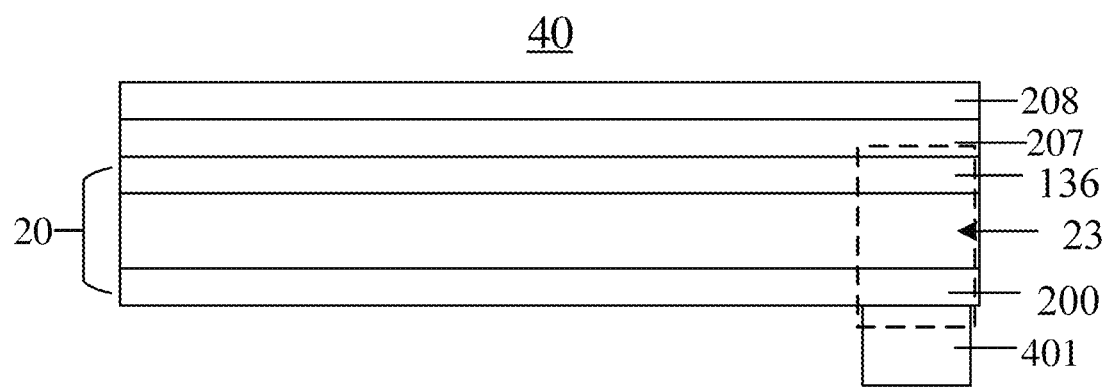
FIG. 10B is a cross-sectional view of FIG. 10A along a section line C-C'.

At least one embodiment of the present disclosure further provides a display apparatus; the display apparatus includes any one of the above-described display substrates 20 and a sensor. FIG. 10A shows a structural schematic diagram of a display apparatus 40 provided by some embodiments of the present disclosure; and FIG. 10B is a cross-sectional view of the display apparatus shown in FIG. 10A along C-C'.

As shown in FIG. 10A, the sensor 401 is correspondingly provided in the third display region 23 of the display substrate 20 and arranged on a side of the display substrate that is opposite to a display side, for example, arranged on a side of the base substrate 200 that is away from the light-emitting element. The sensor 401 is, for example, a photoelectric sensor configured to receive light from the first side of the display substrate and convert the light into electrical signals for forming an image. For example, the light reaches the sensor from the display side via the third display region 23, for example, the light is visible light or infrared light.

For example, the display apparatus 40 further includes an encapsulation layer 207 and a cover plate 208 provided on the display substrate 20; and the encapsulation layer 207 is configured to seal the light-emitting element in the display substrate 20 to prevent external moisture and oxygen from permeating the light-emitting element and the drive circuit and causing damage to the device. For example, the encapsulation layer 207 includes an organic thin film or a structure in which organic thin films and inorganic thin films are alternately stacked. For example, a water absorbing layer (not shown) may also be provided between the encapsulation layer 207 and the display substrate 20, and is configured to absorb residual water vapor or sol in a pre-fabrication process of the light-emitting element. The cover plate 208 is, for example, a glass cover plate. For example, the cover plate 208 and the encapsulation layer 207 may be an integral structure.

For example, the sensor 401 may be attached to a back side of the display substrate 20 (a side opposite to the display side). As shown in FIG. 10B, the imaging element 401 is attached to a side of the base substrate 200 that is away from the second electrode 136 of the light-emitting element. The sensor 401 may be, for example, implemented as a camera.

For example, the display apparatus may be a digital photo frame, a smart bracelet, a smart watch, a mobile phone, a tablet personal computer, a monitor, a laptop, a navigator, and any other product or component having a display function.

The above descriptions are merely exemplary implementations of the present disclosure, and are not used to limit the protection scope of the present disclosure, which is determined by the appended claims.

The invention claimed is:

1. A display substrate, having a first side for display and a second side opposite to the first side, wherein the display substrate comprises a display region, the display region comprises a plurality of pixel circuit units on a base substrate, the plurality of pixel circuit units are arranged in a plurality of rows and columns along a first direction and a second direction, and the first direction is different from the second direction;

each of the plurality of pixel circuit units comprises a drive sub-circuit and a first connection electrode for being connected with a light-emitting element; a first terminal of the drive sub-circuit is configured to receive a pixel power voltage, a second terminal of the drive sub-circuit is configured to be electrically connected with the light-emitting element through the first connection electrode, and the drive sub-circuit of the pixel circuit unit is configured to form a driving current flowing through the light-emitting element in response to the pixel power voltage;

the display region comprises a first display region and a second display region;

the first display region comprises a plurality of first sub-pixels, each first sub-pixel comprises a first pixel circuit, and the first pixel circuit comprises one pixel circuit unit;

the second display region comprises a plurality of second sub-pixels, each second sub-pixel comprises a second pixel circuit, and the second pixel circuit comprises two adjacent pixel circuit units; first connection electrodes of two pixel circuit units of the each second pixel circuit are electrically connected with each other to be connected to a same light-emitting element;

a pixel density of the plurality of first sub-pixels in the first display region is higher than a pixel density of the plurality of second sub-pixels in the second display region;

the display substrate further comprises a first power voltage terminal and a second power voltage terminal, and the first power voltage terminal and the second power voltage terminal are insulated from each other; the first power voltage terminal is configured to be able to output a first power voltage, the second power voltage terminal is configured to be able to output a second power voltage, and the first power voltage is different from the second power voltage;

the first terminal of the drive sub-circuit of the pixel circuit unit in the first pixel circuit is configured to be connected with the first power voltage terminal to receive the first power voltage as the pixel power voltage of the pixel circuit unit of the first pixel circuit, and the first terminal of the drive sub-circuit of each of the two pixel circuit units in the second pixel circuit is configured to be connected with the second power voltage terminal to receive the second power voltage as the pixel power voltage of the two pixel circuit units of the second pixel circuit.

2. The display substrate according to claim 1, further comprising a plurality of first power lines and a plurality of second power lines extended along the second direction, wherein the plurality of first power lines and the plurality of second power lines are respectively arranged along the first direction;

the plurality of first power lines and the plurality of second power lines are arranged in a same layer and insulated from each other;

the plurality of first power lines are electrically connected with the first power voltage terminal and drive sub-circuits of the plurality of first sub-pixels to supply the first power voltage; and the plurality of second power lines are electrically connected with the second power voltage terminal and drive sub-circuits of the plurality of second sub-pixels to supply the second power voltage.

3. The display substrate according to claim 2, wherein the plurality of second power lines are in one-to-one correspondence with the plurality of first power lines; and each second power line and a first power line corresponding to the each second power line are arranged along the second direction and spaced apart from each other.

4. The display substrate according to claim 2, further comprising a non-display region and a power wire in the non-display region, wherein the power wire is arranged around the display region, and electrically connects the second power voltage terminal and the plurality of second power lines.

5. The display substrate according to claim 1, wherein the first display region further comprises a plurality of first light-emitting elements,
the plurality of first light-emitting elements are respectively electrically connected with the first connection electrodes of the pixel circuit units of the plurality of first pixel circuits in one-to-one correspondence.

6. The display substrate according to claim 5, wherein a count of second pixel circuits in the second display region is X, the second display region further comprises Y second light-emitting elements, the Y second light-emitting elements are electrically connected with Y second pixel circuits among the X second pixel circuits in one-to-one correspondence, X and Y are both positive integers, and Y is less than X;
each of the Y second light-emitting elements is electrically connected with each of first connection electrodes of both two pixel circuit units in a second pixel circuit corresponding to the each second light-emitting element.

7. The display substrate according to claim 5, wherein the display region further comprises a third display region at least partially surrounded by the second display region,
the third display region is configured to allow light to transmit from the first side to the second side for sensing;
the third display region comprises Z third light-emitting elements, the Z third light-emitting elements are electrically connected with Z second pixel circuits in the plurality of second sub-pixels in one-to-one correspondence, and Z is a positive integer and Z is less than or equal to X-Y;
each third light-emitting element is electrically connected with first connection electrodes of both two pixel circuit units in a second pixel circuit corresponding to the each third light-emitting element.

8. The display substrate according to claim 7, wherein each of the Z third light-emitting elements comprises a first electrode, a second electrode and a light-emitting layer; and the first electrode of each third light-emitting element is closer to the base substrate than the second electrode of the each third light-emitting element;
the display substrate further comprises a plurality of fourth connection electrodes; and the plurality of fourth connection electrodes are arranged in one-to-one correspondence with the plurality of third light-emitting elements,
each fourth connection electrode electrically connects a first electrode of a third light-emitting element corresponding to the each fourth connection electrode to first connection electrodes of two pixel circuit units corresponding to the third light-emitting element.

9. The display substrate according to claim 8, wherein the plurality of fourth connection electrodes are in the second display region, and are on a side, which is close to the base substrate, of first electrodes of the plurality of third light-emitting elements.

10. The display substrate according to claim 9, further comprising a plurality of connection lines,
wherein the plurality of connection lines are extended from the second display region to the third display region,
the plurality of connection lines are arranged in one-to-one correspondence with the plurality of fourth connection electrodes and in one-to-one correspondence with the plurality of third light-emitting elements; and a fourth connection electrode corresponding to each of the plurality of connection lines is connected with a first electrode of a third light-emitting element corresponding to the each connection line.

11. The display substrate according to claim 10, wherein the plurality of connection lines and the plurality of fourth connection electrodes are in a same layer; and each of the plurality of connection lines and a fourth connection electrode corresponding to the each connection line are in an integral structure.

12. A display apparatus, comprising the display substrate according to claim 1.

13. The display apparatus according to claim 12, further comprising a sensor, wherein the sensor is provided on the second side of the display substrate, and is configured to receive light from the first side of the display substrate.

14. A display substrate, having a first side for display and a second side opposite to the first side, wherein the display substrate comprises a display region, the display region comprises a plurality of pixel circuit units on a base substrate, the plurality of pixel circuit units are arranged in a plurality of rows and columns along a first direction and a second direction, and the first direction is different from the second direction;
each of the plurality of pixel circuit units comprises a drive sub-circuit and a first connection electrode for being connected with a light-emitting element; a first terminal of the drive sub-circuit is configured to receive a pixel power voltage, a second terminal of the drive sub-circuit is configured to be electrically connected with the light-emitting element through the first connection electrode, and the drive sub-circuit of the pixel circuit unit is configured to form a driving current flowing through the light-emitting element in response to the pixel power voltage;
the display region comprises a first display region and a second display region;
the first display region comprises a plurality of first sub-pixels, each first sub-pixel comprises a first pixel circuit, and the first pixel circuit comprises one pixel circuit unit;
the second display region comprises a plurality of second sub-pixels, each second sub-pixel comprises a second pixel circuit, and the second pixel circuit comprises two adjacent pixel circuit units; first connection electrodes of two pixel circuit units of the each second pixel circuit are electrically connected with each other to be connected to a same light-emitting element;
a pixel density of the plurality of first sub-pixels in the first display region is higher than a pixel density of the plurality of second sub-pixels in the second display region;
the display substrate further comprises a first power voltage terminal and a second power voltage terminal, and the first power voltage terminal and the second power voltage terminal are insulated from each other;
the first power voltage terminal is configured to be able to output a first power voltage, the second power voltage terminal is configured to be able to output a second power voltage, and the first power voltage is different from the second power voltage;
the first pixel circuit is configured to be connected with the first power voltage terminal to receive the first power voltage as a pixel power voltage of a pixel circuit unit of the first pixel circuit, and
the second pixel circuit is configured to be connected with the second power voltage terminal to receive the second power voltage as a pixel power voltage of two pixel circuit units of the second pixel circuit;
the display substrate further comprises a plurality of first power lines and a plurality of second power lines extended along the second direction,
wherein the plurality of first power lines and the plurality of second power lines are respectively arranged along the first direction;
the plurality of first power lines and the plurality of second power lines are arranged in a same layer and insulated from each other;
the plurality of first power lines are electrically connected with the first power voltage terminal and drive sub-circuits of the plurality of first sub-pixels to supply the first power voltage; and
the plurality of second power lines are electrically connected with the second power voltage terminal and drive sub-circuits of the plurality of second sub-pixels to supply the second power voltage; and
the plurality of third power lines and the plurality of fourth power lines are arranged along the second direction;
the plurality of third power lines and the plurality of fourth power lines are arranged in a same layer and insulated from each other, and are located on a side, which is close to the base substrate, of the plurality of first power lines and the plurality of second power lines;
the plurality of third power lines are in one-to-one correspondence with the plurality of fourth power lines, and each third power line and a fourth power line corresponding to the each third power line are arranged along the first direction and spaced apart from each other.

15. The display substrate according to claim 14, wherein each third power line is electrically connected with at least one of the plurality of first power lines through at least one first via hole;
each fourth power line is electrically connected with at least one of the plurality of second power lines through at least one second via hole.

16. The display substrate according to claim 14, wherein the each pixel circuit unit further comprises a data writing sub-circuit, a compensating sub-circuit and a storage sub-circuit;
the data writing sub-circuit comprises a control terminal, a first terminal and a second terminal; and the second terminal of the data writing sub-circuit is electrically connected with the drive sub-circuit;
the compensating sub-circuit comprises a control terminal, a first terminal and a second terminal; the control terminal of the compensating sub-circuit is configured to receive a scan signal; the first terminal and the second terminal of the compensating sub-circuit are respectively electrically connected with the second terminal and the control terminal of the drive sub-circuit; and the compensating sub-circuit is configured to perform threshold compensation on the drive sub-circuit in response to the scan signal;
the storage sub-circuit is electrically connected with the control terminal of the drive sub-circuit and the pixel power voltage terminal;
the storage sub-circuit comprises a storage capacitor; the storage capacitor comprises a first capacitor electrode and a second capacitor electrode; the first capacitor electrode is configured to receive the pixel power voltage; and the second capacitor electrode is connected with the control terminal of the drive sub-circuit.

17. The display substrate according to claim 16, wherein the plurality of third power lines are respectively arranged in one-to-one correspondence with the plurality of rows of first pixel circuits; and the plurality of fourth power lines are respectively arranged in one-to-one correspondence with the plurality of rows of second pixel circuits;
each third power line is integrally formed with first capacitor electrodes of pixel circuit units of a row of first sub-pixels corresponding to the each third power line; and each fourth power line is integrally formed with first capacitor electrodes of pixel circuit units of a row of second sub-pixels of the each fourth power line.

18. The display substrate according to claim 16, wherein first terminals of data writing sub-circuits of the two pixel circuit units of the second pixel circuit are electrically connected with each other.

19. The display substrate according to claim 18, wherein the second pixel circuit further comprises a second connection electrode, and the second connection electrode electrically connects the first terminals of the data writing sub-circuits of the two pixel circuit units of the second pixel circuit.

20. The display substrate according to claim 19, wherein the second connection electrode is in a same layer as and insulated from the first capacitor electrodes of the two pixel circuit units of the second pixel circuit.

21. The display substrate according to claim 18, further comprising a plurality of main data lines and a plurality of auxiliary data lines extended along the second direction,
wherein the plurality of main data lines are arranged along the first direction; and the plurality of auxiliary data lines are arranged along the first direction;
the plurality of main data lines are electrically connected with first terminals of data writing sub-circuits of the plurality of columns of pixel circuit units in the first display region in one-to-one correspondence to supply first data signals;
the plurality of auxiliary data lines are electrically connected with first terminals of data writing sub-circuits of the plurality of columns of pixel circuit units in the second display region to supply second data signals;
the plurality of auxiliary data lines are in one-to-one correspondence with the plurality of main data lines; and each of the plurality of auxiliary data lines and a main data line corresponding to the each auxiliary data line are arranged in parallel in the second direction.

22. The display substrate according to claim 21, wherein the plurality of main data lines and the plurality of auxiliary data lines are in a same layer and are on a side of the first capacitor electrode away from the base substrate.

23. The display substrate according to claim 21, wherein the plurality of auxiliary data lines are divided into a plurality of data line groups; and each data line group comprises two of the plurality of auxiliary data lines;

the plurality of data line groups are respectively electrically connected with the plurality of columns of second pixel circuits in one-to-one correspondence.

24. The display substrate according to claim 23, wherein two second pixel circuits in a same column and in an nth row and an (n+1)th row of the plurality of rows of second pixel circuits form a pixel circuit group, and share one auxiliary data line;

n is an odd number or an even number greater than 0.

25. The display substrate according to claim 24, wherein in each column of second pixel circuits along the second direction, a plurality of pixel circuit groups are alternately electrically connected with two auxiliary data lines in a data line group corresponding to the each column of second pixel circuits.

26. The display substrate according to claim 23, wherein two adjacent data line groups comprise four auxiliary data lines, which are respectively a first data line, a second data line, a third data line and a fourth data line sequentially arranged in the first direction; and the first data line is directly electrically connected with its corresponding main data line.

27. The display substrate according to claim 26, wherein the second data line, the third data line, and the fourth data line are respectively arranged in a same layer as and spaced apart from its corresponding main data line.

28. The display substrate according to claim 27, wherein the fourth data line is electrically connected with a main data line corresponding to the second data line through a third connection electrode.

29. The display substrate according to claim 28, wherein the third connection electrode is in a same layer as and insulated from the first connection electrode, and the third connection electrode is at a boundary between the first display region and the second display region.

30. The display substrate according to claim 27, wherein the third data line and the fourth data line are both configured to receive the second data signals from a side, which is away from the first display region in the second direction, of the second display region.

31. A display substrate, having a first side for display and a second side opposite to the first side, wherein the display substrate comprises a display region, the display region comprises a plurality of pixel circuit units on a base substrate, the plurality of pixel circuit units are arranged in a plurality of rows and columns along a first direction and a second direction, and the first direction is different from the second direction;

each of the plurality of pixel circuit units comprises a drive sub-circuit and a first connection electrode for being connected with a light-emitting element; a first terminal of the drive sub-circuit is configured to receive a pixel power voltage, a second terminal of the drive sub-circuit is configured to be electrically connected with the light-emitting element through the first connection electrode, and the drive sub-circuit of the pixel circuit unit is configured to form a driving current flowing through the light-emitting element in response to the pixel power voltage;

the display region comprises a first display region and a second display region;

the first display region comprises a plurality of first sub-pixels, each first sub-pixel comprises a first pixel circuit, and the first pixel circuit comprises one pixel circuit unit;

the second display region comprises a plurality of second sub-pixels, each second sub-pixel comprises a second pixel circuit, and the second pixel circuit comprises two adjacent pixel circuit units; first connection electrodes of two pixel circuit units of the each second pixel circuit are electrically connected with each other to be connected to a same light-emitting element;

a pixel density of the plurality of first sub-pixels in the first display region is higher than a pixel density of the plurality of second sub-pixels in the second display region;

the display substrate further comprises a first power voltage terminal and a second power voltage terminal, and the first power voltage terminal and the second power voltage terminal are insulated from each other; the first power voltage terminal is configured to be able to output a first power voltage, the second power voltage terminal is configured to be able to output a second power voltage, and the first power voltage is different from the second power voltage;

the first pixel circuit is configured to be connected with the first power voltage terminal to receive the first power voltage as a pixel power voltage of a pixel circuit unit of the first pixel circuit, and the second pixel circuit is configured to be connected with the second power voltage terminal to receive the second power voltage as a pixel power voltage of two pixel circuit units of the second pixel circuit;

the first display region further comprises a plurality of first light-emitting elements . . . and the plurality of first light-emitting elements are respectively electrically connected with the first connection electrodes of the pixel circuit units of the plurality of first pixel circuits in one-to-one correspondence;

a count of second pixel circuits in the second display region is X, the second display region further comprises Y second light-emitting elements, the Y second light-emitting elements are electrically connected with Y second pixel circuits among the X second pixel circuits in one-to-one correspondence, X and Y are both positive integers, and Y is less than X;

each of the Y second light-emitting elements is electrically connected with each of first connection electrodes of both two pixel circuit units in a second pixel circuit corresponding to the each second light-emitting element;

an area of a light-emitting region of at least one of the Y second light-emitting elements is larger than an area of a light-emitting region of a first light-emitting element emitting light of a same color as the at least one second light-emitting element.

\* \* \* \* \*

UNITED STATES PATENT AND TRADEMARK OFFICE
CERTIFICATE OF CORRECTION

PATENT NO. : 12,219,812 B2
APPLICATION NO. : 17/763026
DATED : February 4, 2025
INVENTOR(S) : Feng Wei et al.

Page 1 of 1

It is certified that error appears in the above-identified patent and that said Letters Patent is hereby corrected as shown below:

In the Claims

In Column 40, Line 38 (Claim 31): before "elements" delete "...".

Signed and Sealed this
Twenty-ninth Day of April, 2025

Coke Morgan Stewart
*Acting Director of the United States Patent and Trademark Office*